United States Patent
Kilian et al.

(10) Patent No.: US 11,483,028 B2
(45) Date of Patent: Oct. 25, 2022

(54) INTERLEAVING FOR THE TRANSFER OF TELEGRAMS WITH A VARIABLE NUMBER OF SUB-PACKETS AND SUCCESSIVE DECODING

(71) Applicants: Fraunhofer-Gesellschaft zur Förderung der angewandten Forschung e.V., Munich (DE); Friedrich-Alexander-Universitaet Erlangen-Nuernberg, Erlangen (DE)

(72) Inventors: Gerd Kilian, Erlangen (DE); Josef Bernhard, Erlangen (DE); Jörg Robert, Erlangen (DE); Jakob Kneißl, Erlangen (DE); Johannes Wechsler, Erlangen (DE)

(73) Assignees: FRAUNHOFER-GESELLSCHAFT ZUR FÖRDERUNG DER ANGEWANDTEN FORSCHUNG E.V., Munich (DE); FRIEDRICH-ALEXANDER-UNIVERSITAET ERLANGEN-NUERNBERG, Erlangen (DE)

( * ) Notice: Subject to any disclaimer, the term of this patent is extended or adjusted under 35 U.S.C. 154(b) by 0 days.

(21) Appl. No.: 16/387,496

(22) Filed: Apr. 17, 2019

(65) Prior Publication Data
US 2019/0288741 A1 Sep. 19, 2019

Related U.S. Application Data

(63) Continuation of application No. PCT/EP2017/076939, filed on Oct. 23, 2017.

(30) Foreign Application Priority Data
Oct. 24, 2016 (DE) ...................... 10 2016 220 886.1

(51) Int. Cl.
*H04B 1/7143* (2011.01)
*H04L 1/00* (2006.01)
(Continued)

(52) U.S. Cl.
CPC .......... *H04B 1/7143* (2013.01); *H03M 13/27* (2013.01); *H03M 13/2703* (2013.01);
(Continued)

(58) Field of Classification Search
CPC ... H04L 1/0084; H04L 1/0041; H04L 1/0071; H04L 5/0012; H04L 1/0083;
(Continued)

(56) References Cited

U.S. PATENT DOCUMENTS 6,226,616 B1 * 5/2001 You ...................... G10L 19/008
704/500
6,259,744 B1 7/2001 Lee et al.
(Continued)

FOREIGN PATENT DOCUMENTS

| CN | 1385982 A | 12/2002 |
| CN | 101166273 A | 4/2008 |

(Continued)

OTHER PUBLICATIONS

Kilian, G., et al.; "Improved Coverage for Low-Power Telemetry Systems using Telegram Splitting;" Proceedings of 2013 European Conference on Smart Objects, Systems and Technologies (SmartSysTech); Jun. 2013; pp. 1-6.
(Continued)

*Primary Examiner* — Aristocratis Fotakis
(74) *Attorney, Agent, or Firm* — McClure, Qualey & Rodack, LLP

(57) ABSTRACT

Embodiments provide a transfer method for wirelessly transferring data in a communication system (e.g. a sensor network or telemetry system). The data includes core data
(Continued)

and extension data, wherein the core data is encoded and distributed in an interleaved manner to a plurality of core sub-data packets, wherein the extension data is encoded and distributed in an interleaved manner to a plurality of extension sub-data packets, wherein at least a part of the core data contained in the core sub-data packets is needed for receiving the extension data or extension data packets.

31 Claims, 19 Drawing Sheets

(51) Int. Cl.
*H03M 13/27* (2006.01)
*H03M 13/37* (2006.01)
*H03M 13/33* (2006.01)

(52) U.S. Cl.
CPC ..... *H03M 13/333* (2013.01); *H03M 13/3776* (2013.01); *H04L 1/007* (2013.01); *H04L 1/0041* (2013.01); *H04L 1/0071* (2013.01); *H04L 1/0083* (2013.01); *H04L 1/0084* (2013.01); *H04L 1/0089* (2013.01); *H03M 13/2707* (2013.01)

(58) Field of Classification Search
CPC ............ H04B 1/7143; H03M 13/2703; H03M 13/3776; H03M 13/27; H03M 13/2707
See application file for complete search history.

(56) References Cited

U.S. PATENT DOCUMENTS

| | | | |
|---|---|---|---|
| 6,275,506 B1* | 8/2001 | Fazel | H04J 4/00 370/459 |
| 8,121,097 B2 | 2/2012 | Li et al. | |
| 2005/0135308 A1* | 6/2005 | Vijayan | H04L 5/0041 370/330 |
| 2005/0249266 A1* | 11/2005 | Brown | H04B 1/713 375/133 |
| 2006/0140302 A1 | 6/2006 | Jahan et al. | |
| 2006/0171283 A1* | 8/2006 | Vijayan | H04L 27/3488 369/94 |
| 2007/0015383 A1 | 1/2007 | Jahn et al. | |
| 2008/0019425 A1 | 1/2008 | Gorokhov | |
| 2010/0260098 A1 | 10/2010 | Ulupinar et al. | |
| 2013/0128876 A1 | 5/2013 | Kilian et al. | |
| 2014/0176341 A1 | 6/2014 | Bernhard et al. | |
| 2014/0192789 A1 | 7/2014 | Bernhard et al. | |
| 2016/0165273 A1 | 6/2016 | Moon et al. | |
| 2016/0294509 A1* | 10/2016 | Shin | H04L 1/0052 |
| 2016/0294598 A1 | 10/2016 | Shin et al. | |
| 2016/0352873 A1* | 12/2016 | Oh | H04L 69/22 |
| 2017/0290085 A1 | 10/2017 | Islam et al. | |
| 2018/0131457 A1* | 5/2018 | Michael | H04H 60/40 |
| 2018/0152264 A1 | 5/2018 | Kilian et al. | |
| 2018/0183491 A1* | 6/2018 | Takeda | H04B 7/12 |
| 2018/0302896 A1 | 10/2018 | Nayeb et al. | |
| 2019/0007249 A1* | 1/2019 | Lee | H03M 13/356 |
| 2020/0336241 A1* | 10/2020 | Kilian | H04L 1/0003 |
| 2022/0070034 A1* | 3/2022 | Nakada | H04N 21/2365 |

FOREIGN PATENT DOCUMENTS

| | | |
|---|---|---|
| CN | 101690240 A | 3/2010 |
| CN | 103109483 A | 5/2013 |
| CN | 105531994 A | 4/2016 |
| DE | 10 2011 082 098 B4 | 3/2013 |
| DE | 10 2011 082 100 A1 | 3/2013 |
| EP | 0 540 232 A2 | 5/1993 |
| EP | 1 355 471 A2 | 10/2003 |
| EP | 1 892 871 A2 | 2/2008 |
| EP | 2 461 513 A1 | 6/2012 |
| EP | 2 461 513 B1 | 4/2013 |
| EP | 2 629 444 A1 | 8/2013 |
| EP | 3 125 453 A1 | 2/2017 |
| JP | A09008703 | 10/1997 |
| JP | 2001101806 A | 4/2001 |
| JP | 2012507974 A | 3/2012 |
| KR | 1020070063463 A | 6/2007 |
| KR | 101412666 B1 | 6/2014 |
| RU | 2431923 C2 | 10/2011 |
| RU | 2557164 C2 | 7/2015 |
| WO | 2008/130169 A1 | 10/2008 |
| WO | 2012/007565 A2 | 1/2012 |
| WO | 2010053686 A1 | 3/2012 |
| WO | 2015/128385 A1 | 9/2015 |
| WO | 2016/118060 A1 | 7/2016 |

OTHER PUBLICATIONS

Kilian, G., et al.; "Increasing Transmission Reliability for Telemetry Systems Using Telegram Splitting;" IEEE Transactions on Communications; vol. 63; No. 3; Mar. 2015; pp. 949-961.

Dolinar, S., et al.; "Turbo Code Performance as a Function of Code Block Size;" 1998 IEEE International Symposium on Information Theory; pp. 1.

Dolinar, S., et al.; "Code Performance as a Function of Block Size;" TMO progress report; vol. 42; 1998; p. 133.

Wang, Y.P.E., et al.; "To Bite or Not to Bite—A Study of Tail Bits Versus Tail-Biting;" IEEE International Symposium on Personal, Indoor and MobileRadio Communications; vol. 2; Oct. 1996; pp. 317-321; XP001001344.

Russian language office action dated Dec. 26, 2019 and accompanying search report, issued in application No. 2019115840.

English language translation of Russian office action dated Dec. 26, 2019 and accompanying search report, issued in application No. 2019115840.

EP Office Action dated Sep. 28, 2021 in EP application No. 17791038.7-1216.

Chinese language office action dated May 26, 2021, issued in application No. CN 201780080315.3.

English language translation of Chinese office action.

Yang, R., "On key technologies for convergence of heterogeneous networks of LET and HSPA;" China Doctoral Dissertation Full-text Database (Electronic Journal) Information Science and Technology Series; pp. 1-140.

Nokia Siemens Networks;"Clean up and update on security, scheduling, mobility, MBMS and DRX;" 3GPP TSG-RAN2 Meeting #60 R2-075449; Nov. 2007; pp. 1-107.

Davis, L.M., et al.; "System architecture and ASICs for a MIMO 3GPP-HSDPA receiver;" The 57th IEEE Semiannual Vehicular technology Conference; 2003; pp. 818-822.

* cited by examiner

INTERLEAVING FOR THE TRANSFER OF TELEGRAMS WITH A VARIABLE NUMBER OF SUB-PACKETS AND SUCCESSIVE DECODING

CROSS-REFERENCE TO RELATED APPLICATION

This application is a continuation of copending International Application No. PCT/EP2017/076939, filed Oct. 23, 2017, which is incorporated herein by reference in its entirety, and additionally claims priority from German Application No. DE 10 2016 220 886.1, filed Oct. 24, 2016, which is incorporated herein by reference in its entirety.

BACKGROUND OF THE INVENTION

Embodiments of the present invention refer to a data transmitter for transmitting data. Further embodiments refer to a data receiver for receiving data. Some embodiments refer to interleaving for the transfer of telegrams with a variable number of sub-packets and successive decoding.

DE100 2011 082 098 B4 describes a method for battery-operated transmitters, in which the data packet is split into transmission packets (or sub-data packets) that are smaller than the actual information to be transferred (so-called telegram splitting). In this case, telegrams are distributed to several partial packets (or sub-data packets). Such a partial packet is referred to as hop. Several information symbols are transferred in one hop. The hops are transmitted on one frequency or distributed across several frequencies, so-called frequency hopping. Between the hops, there are pauses in which transmission does not take place.

Since several radio transmissions share one medium for the transmission, it may occur that a sub-packet (or sub-data packet) is being interfered with by another transmission in such a way that it may not be decoded at the receiver. In order to solve this problem, channel-coding of the data to be transferred is performed, e.g. by a convolution encoder which inserts redundancy into the signal in order to be able to correctly decode the same even with corrupted parts.

The performance of this channel-coding often depends on how many consecutive symbols are being interfered with. Since an interferer often interferes with successive symbols, the symbols are interleaved after the channel-coding such that symbols in the transmitted telegram have the greatest possible distance to each other in the channel-encoded code word.

However, interleaving the symbols has the consequence that the information of the telegram may only be recovered as a whole since the information is scattered across the entire telegram. With this, it is not possible to analyze a length field that would allow receiving a variable number of sub-packets. For example, if the length field alone is placed in front, it is not part of the channel-coding, and not receiving the sub-packet with the length information results in the total loss of the telegram.

DE 10 2011 082 100 A1 describes a base station with a bidirectional data transfer to a node. The base station comprises a unit for receiving a data packet transmitted by the node with a node transmission frequency, wherein the node transmission frequency is derived from a frequency generator of the node. The base station further comprises a unit for determining the node transmission frequency based on the received data packet and for determining a deviation of the frequency generator of the node based on a frequency deviation between the determined node transmission frequency and a target node transmission frequency associated with the node. In addition, the base station comprises a unit for transmitting a data packet to the node with a base station transmission frequency, wherein the unit for transmitting the data packet is configured to adjust the base station transmission frequency based on the determined deviation of the frequency generator of the node.

WO 2015/128385 A1 describes a data transmission arrangement comprising an energy harvesting element as an energy source. The data transmission arrangement is configured to transmit data using the telegram splitting method, wherein a partial packet to be transmitted is either transmitted, buffered and transmitted at a later time, or discarded depending on an amount of electrical energy that may be provided by the energy supply unit.

The publication [G. Kilian, H. Petkov, R. Psiuk, H. Lieske, F. Beer, J. Robert, and A. Heuberger, "Improved coverage for low-power telemetry systems using telegram splitting," in Proceedings of 2013 European Conference on Smart Objects, Systems and Technologies (SmartSysTech), 2013.] describes an improved range for low-energy telemetry systems using the telegram splitting method.

The publication [G. Kilian, M. Breiling, H. H. Petkov, H. Lieske, F. Beer, J. Robert, and A. Heuberger, "Increasing Transmission Reliability for Telemetry Systems Using Telegram Splitting," IEEE Transactions on Communications, vol. 63. no. 3, pp. 949-961, March 2015.] describes an improved transfer reliability for low-energy telemetry systems using the telegram splitting method.

The publication [Sam Dolinar, Dariush Divsalar, and Fabrizio Pollara, "Turbo Code Performance as a Function of Code Block Size", 1998 IEEE International Symposium on Information Theory] describes the performance of turbo codes in dependence on a block size.

SUMMARY

An embodiment may have a data transmitter configured to encode and interleave core data and to distribute the same to a plurality of core sub-data packets, wherein the data transmitter is configured to encode extension data and to distribute the same in an interleaved manner to a plurality of extension sub-data packets, wherein at least a part of the encoded core data contained in the core sub-data packets is needed for receiving the encoded extension data or extension sub-data packets; wherein the plurality of core sub-data packets is transferred using a time hopping pattern and/or a frequency hopping pattern; wherein the plurality of extension sub-data packets is transferred using a time hopping pattern and/or a frequency hopping pattern.

Another embodiment may have a data receiver configured to receive core sub-data packets and extension sub-data packets, wherein the core sub-data packets include encoded core data distributed in an interleaved manner across the core sub-data packets, and wherein the extension sub-data packets contain encoded extension data distributed in an interleaved manner across the extension sub-data packets; wherein the data receiver is configured to decode at least a part of the encoded core data to obtain information with respect to the encoded extension data or extension sub-data packets; wherein the data receiver is configured to receive the extension data packets using the information; wherein the plurality of core sub-data packets is transferred using a time hopping pattern and/or a frequency hopping pattern; wherein the plurality of extension sub-data packets is transferred using a time hopping pattern and/or a frequency hopping pattern.

According to another embodiment, a system may have: an inventive data transmitter; and an inventive data receiver.

According to another embodiment, a method may have the steps of: encoding core data to obtain encoded core data; interleaving and distributing the encoded core data to a plurality of core sub-data packets; encoding extension data to obtain encoded extension data; interleaving and distributing the encoded extension data to a plurality of extension data packets; transmitting the core sub-data packets and extension data packets; wherein at least a part of the encoded core data contained in the core sub-data packets is needed for receiving the encoded extension data or extension sub-data packets; wherein the plurality of core sub-data packets is transferred using a time hopping pattern and/or a frequency hopping pattern; wherein the plurality of extension sub-data packets is transferred using a time hopping pattern and/or a frequency hopping pattern.

According to another embodiment, a method may have the steps of: receiving core sub-data packets and extension sub-data packets, wherein the core sub-data packets contain core data distributed in an interleaved manner across the core sub-data packets, and wherein the extension sub-data packets contain extension data distributed in an interleaved manner across the extension sub-data packets; decoding at least a part of the encoded core data to obtain information with respect to the extension data packets; wherein the extension data packets are received using the information; wherein the plurality of core sub-data packets is transferred using a time hopping pattern and/or a frequency hopping pattern; wherein the plurality of extension sub-data packets is transferred using a time hopping pattern and/or a frequency hopping pattern.

Another embodiment may have a non-transitory digital storage medium having a computer program stored thereon to perform the method having the steps of: encoding core data to obtain encoded core data; interleaving and distributing the encoded core data to a plurality of core sub-data packets; encoding extension data to obtain encoded extension data; interleaving and distributing the encoded extension data to a plurality of extension data packets; transmitting the core sub-data packets and extension data packets; wherein at least a part of the encoded core data contained in the core sub-data packets is needed for receiving the encoded extension data or extension sub-data packets; wherein the plurality of core sub-data packets is transferred using a time hopping pattern and/or a frequency hopping pattern; wherein the plurality of extension sub-data packets is transferred using a time hopping pattern and/or a frequency hopping pattern, when said computer program is run by a computer.

Another embodiment may have a non-transitory digital storage medium having a computer program stored thereon to perform the method having the steps of: receiving core sub-data packets and extension sub-data packets, wherein the core sub-data packets contain core data distributed in an interleaved manner across the core sub-data packets, and wherein the extension sub-data packets contain extension data distributed in an interleaved manner across the extension sub-data packets; decoding at least a part of the encoded core data to obtain information with respect to the extension data packets; wherein the extension data packets are received using the information; wherein the plurality of core sub-data packets is transferred using a time hopping pattern and/or a frequency hopping pattern; wherein the plurality of extension sub-data packets is transferred using a time hopping pattern and/or a frequency hopping pattern, when said computer program is run by a computer.

Another embodiment may have a data transmitter configured to encode data of fixed length and to distribute the same in an interleaved manner to at least one subset of a plurality of sub-data packets, wherein the data transmitter is further configured to encode data of variable length and to distribute the same in an interleaved manner to at least one subset of the plurality of sub-data packets, so that at least one of the plurality of sub-data packets has a part of the data of fixed length and a part of the data of variable length; wherein the plurality of sub-data packets is transferred using a time hopping pattern and/or a frequency hopping pattern.

Embodiments provide a data transmitter configured to encode core data and to distribute the same in an interleaved manner to a plurality of core sub-data packets, wherein the data transmitter is configured to encode extension data and to distribute the same in an interleaved manner to a plurality of extension sub-data packets, wherein at least a part of the core data contained in the core sub-data packets is needed for receiving the extension data or extension data packets.

Further embodiments provide a data receiver configured to receive core sub-data packets and extension sub-data packets, wherein the core sub-data packets contain core data distributed in an interleaved manner across the core sub-data packets, and wherein the extension sub-data packets contain extension data distributed in an interleaved manner across the extension sub-data packets, wherein the data receiver is configured to decode at least a part of the encoded core data in order to obtain information with respect to the extension data packets, and wherein the data receiver is configured to receive the extension data packets using the information.

According to the concept of the present invention, core sub-data packets and extension sub-data packets are used for the transfer of data of variable length, wherein encoded core data of the data of variable length is distributed in an interleaved manner to the core sub-data packets to increase the transfer reliability of the encoded core data, and wherein encoded extension data of the data of variable length is distributed in an interleaved manner to extension sub-data packets and optionally to the core sub-data packets in order to increase the transfer reliability of the encoded extension data, wherein the encoded core data contains information about the encoded extension data or extension sub-data packets.

Further embodiments provide a method for transmitting core data and extension data. The method includes a step of encoding core data to obtain encoded core data. The method further includes a step of interleaving and distributing the encoded core data to a plurality of core sub-data packets. The method further includes a step of encoding extension data to obtain encoded extension data. The method further includes a step of interleaving and distributing the encoded extension data to a plurality of extension data packets. The method further includes a step of transmitting the core sub-data packets and extension data packets.

Further embodiments provide a method for receiving core data and extension data. The method includes a step of receiving core sub-data packets and extension sub-data packets, wherein the core sub-data packets contain core data distributed in an interleaved manner across the core sub-data packets, and wherein the extension sub-data packets contain extension data distributed in an interleaved manner across the extension sub-data packets. The method further includes a step of decoding at least a part of the encoded core data to obtain information with respect to the extension data packets, wherein the extension data packets are received using the information.

Further embodiments provide a transfer method for wirelessly transferring data in a communication system (e.g. a sensor network or telemetry system). The data includes core data and extension data, wherein the core data is distributed in a encoded and interleaved manner to a plurality of core sub-data packets, wherein the extension data is distributed in a encoded and interleaved manner to a plurality of extension sub-data packets, wherein at least a part of the core data contained in the core sub-data packets is needed for receiving the extension data or extension data packets.

Embodiments of the data transmitter are described in the following.

In embodiments, the data transmitter is configured to not distribute encoded core data to the extension sub-data packets. In other words, the extension sub-data packets do not contain any encoded core data.

In embodiments, the data transmitter may be configured to distribute the encoded core data to the core sub-data packets such that even upon a transfer loss of one or several of the core sub-data packets a receiver-side decoding of the core data is possible based on the other core sub-data packets.

For example, the encoded core data may be successively distributed to the core sub-data packets so that the loss of one of the core sub-data packets does not lead to the total loss of the decoding possibility. For this, immediately successive symbols of the core data may be distributed to immediately successive core sub-data packets, for example.

In embodiments, the data transmitter may be configured to distribute the encoded core data to the core sub-data packets such that a temporal distance of the encoded core data is increased (or even maximized) with respect to an influence length of a code (channel code) used for encoding the core data.

For example, the data transmitter may be configured to distribute symbols of the encoded core data to the core sub-data packets such that a temporal distance of the symbols is increased (or even maximized) with respect to an influence length of a code (channel code) used for encoding the core data.

The performance of the channel-coding may depend on how many successive symbols are being interfered with. Since an interferer often interferes with successive symbols, the symbols may be interleaved after the channel-coding such that they have the largest possible distance from each other in the transmitted core sub-data packets.

In embodiments, the data transmitter may be configured to distribute, if a length of the core data is not sufficient for filling the core sub-data packets, in an interleaved manner the extension data (or a part of the extension data) to the core sub-data packets to fill the core sub-data packets.

In embodiments, the data transmitter may be configured to distribute, when filling the core sub-data packets, the extension data (or a part of the extension data) to the core sub-data packets and the extension sub-data packets such that a distance of the encoded extension data is increased (or even maximized) with respect to an influence length of a code (channel code) used for encoding the extension data.

For example, the data transmitter may be configured to distribute symbols of the encoded extension data to the core sub-data packets such that a temporal distance of the symbols is increased (or even maximized) with respect to an influence length of a code (channel code) used for encoding the core data.

In embodiments, the data transmitter may be configured to distribute, when filling the core sub-data packets, the extension data to the core sub-data packets and the extension sub-data packets such that the core sub-data packets and the extension sub-data packets are evenly filled.

In embodiments, the data transmitter may be configured to distribute, when filling the core sub-data packets, the extension data to the core sub-data packets and the extension sub-data packets such that the core sub-data packets and the extension sub-data packets are unevenly filled.

In embodiments, the data transmitter may be configured to distribute the encoded core data to a fixed or specified number of core sub-data packets.

In embodiments, the data transmitter may be configured to adjust a number of the extension sub-data packets depending on a length of the extension data.

In embodiments, the data transmitter may be configured to encode the core data and the extension data together.

In this case, the core data and the extension data may be encoded together such that decoding the encoded core data delivers at least a part of the core data.

For example, with some channel codes, the performance may be increased if the input length of the data increases, which is why the core data and the extension data may be encoded together. In this case, however, it is to be noted that the core data and the extension data are encoded together such that decoding the core data or at least a part of the core data is also possible without the extension data.

In embodiments, the data transmitter may be configured to encode the core data and the extension data independently of each other.

In embodiments, the data transmitter may be configured to fill the non-encoded core data with extension data so that the extension data is arranged temporally in front of the core data and the reliability is increased when decoding the core data.

In embodiments, the data transmitter may be configured to provide at least a portion of the core sub-data packets with synchronization data.

In this case, the data transmitter may be configured to arrange the core data temporally adjacent to the synchronization data in the respective core sub-data packets.

Furthermore, the data transmitter may be configured to arrange the core data alternatively in front of and behind the synchronization data in temporally (directly) successive core sub-data packets.

In addition, the data transmitter may be configured to temporally arrange the synchronization data in the respective core sub-data packets such that the same are arranged immediately adjacent to the extension data and immediately adjacent to the core data.

In embodiments, the data transmitter may be configured to transmit pure synchronization sub-data packets.

In this case, the data transmitter may be configured to transmit the core sub-data packets and the synchronization sub-data packets such that the core sub-data packets and the synchronization sub-data packets are arranged temporally adjacent to each other.

For example, the synchronization sub-data packets may be transmitted between the core sub-data packets.

Embodiments of the data receiver are described in the following.

In embodiments, the data receiver may know the number of core sub-data packets.

In embodiments, the information with respect to the extension data packets contained in the core sub-data packets may be a number of the extension sub-data packets.

In embodiments, the encoded core data may be distributed to the core sub-data packets such that even upon transfer loss of one or several of the core sub-data packets a receiver-side decoding the core data packets is possible based on the other core sub-data packets. In this case, the data receiver may be configured to receive and decode at least a part of the core sub-data packets to obtain the core data.

For example, the encoded core data may be successively distributed to the core sub-data packets so that the loss of one of the core sub-data packets does not result in a total loss of the decoding possibility. For this, immediately successive symbols of the core data may be distributed to immediately successive core sub-data packets, for example.

In embodiments, at least a portion of the core sub-data packets may be provided with synchronization data, wherein the data receiver may be configured to detect the core sub-data packets in a reception data stream based on at least a portion of the synchronization data.

In embodiments, the data receiver may be configured to receive pure synchronization sub-data packets, and to detect the core sub-data packets in a reception data stream based on at least a portion of the synchronization sub-data packets.

In embodiments, the data receiver may be configured to re-encode at least a part of the decoded core data to obtain re-encoded core data, and to decode at least a part of the encoded extension data using the re-encoded core data.

In embodiments, the data receiver may be configured to decode and to re-encode a first part of the encoded extension data to obtain a first part of re-encoded extension data, and to decode a second part of the encoded extension data using the first part of re-encoded extension data.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
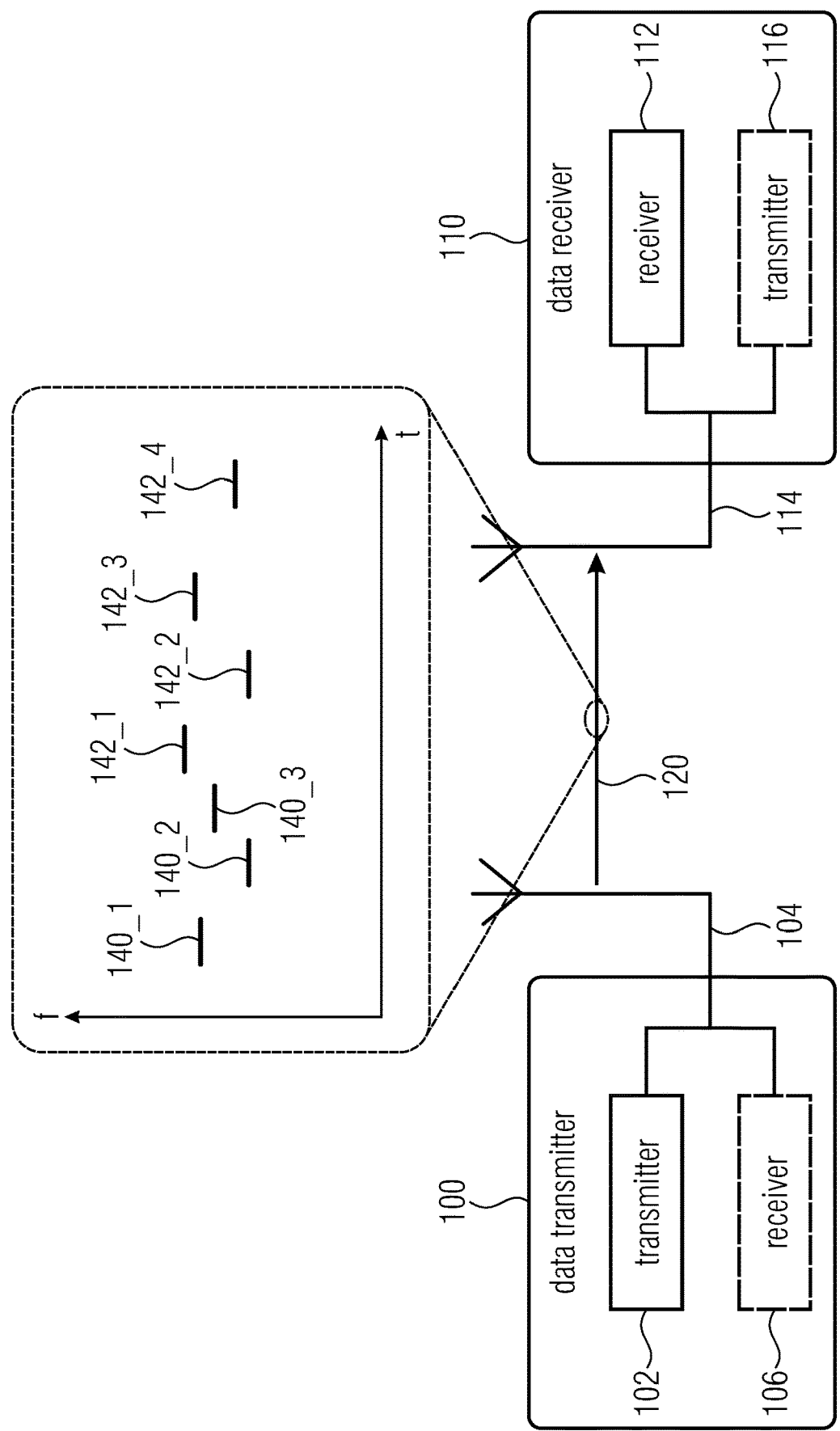
FIG. 1 shows a schematic block circuit diagram of a system having a data transmitter and a data receiver according to an embodiment of the present invention.

In the subsequent description of the embodiments of the present invention, same elements or elements with the same effect are provided in the figures with the same reference numerals so that their descriptions in the different embodiments are interchangeable.

FIG. 1 shows a schematic block circuit diagram of a system having a data transmitter 100 for transmitting data 120 and a data receiver 110 for receiving data 120 according to an embodiment of the present invention. The data 120 may comprise core data and extension data.

The data transmitter 100 is configured to encode the core data and to distribute the same in an interleaved manner to a plurality of core sub-data packets 140_1 to 140_n, and to encode the extension data and to distribute the same in an interleaved manner to a plurality of extension sub-data packets 142_1 to 142_m, wherein at least a part of the core data contained in the core sub-data packets 140_1 to 140_n is needed for receiving the extension data packets.

The data receiver 110 is configured to receive the core sub-data packets 140_1 to 140_n and the extension sub-data packets 142_1 to 142_m, wherein the core sub-data packets 140_1 to 140_n contain the core data distributed in an interleaved manner across the core sub-data packets 140_1 to 140_n, and wherein the extension sub-data packets 142_1 to 142_m contain the extension data distributed in an interleaved manner across the extension sub-data packets 142_1 to 142_m. The data receiver 110 is further configured to decode at least a part of the encoded core data to obtain information with respect to the extension data packets 142_1 to 142_m, and the data receiver 110 is configured to receive the extension data packets 142_1 to 142_m using the information.

In embodiments, the core data may be distributed to n core sub-data packets 140_1 to 140_n, wherein n is a natural number equal to or greater than two, n≥2. The extension data may be distributed to m extension sub-data packets 142_1 to 142_m. That is, the data 120 may be transferred using s=n+m sub-data packets (core sub-data packets+extension sub-data packets), wherein $s_{min}$=n is the minimum number (=number n of core sub-data packets 140_1 to 140_n) of sub-data packets to be transferred.

In embodiments, the extension data may be distributed in an interleaved manner to the core sub-data packets 140_1 to 140_n and also to the extension sub-data packets 142_1 to 142_m. The core sub-data packets 140_1 to 140_n may contain core data and also a part of the extension data.

In embodiments, the core data is not distributed to the extension sub-data packets 142_1 to 142_m. Therefore, the extension sub-data packets 142_1 to 142_m do not contain any core data.

In embodiments, the sub-data packets (core sub-data packets+extension sub-data packets) may be transferred with a temporal distance so that there are transmission pauses between the sub-data packets.

In embodiments, the sub-data packets (core sub-data packets and/or extension sub-data packets) may be transferred using a time hopping pattern and/or frequency hopping pattern.

In embodiments, the frequency hopping pattern may indicate a succession of transmission frequencies or transmission frequency hops with which the sub-data packets are to be transmitted.

For example, a first sub-data packet may be transmitted using a first transmission frequency (or in a first frequency channel) and a second sub-data packet may be transmitted using a second transmission frequency (or in a second frequency channel), wherein the first transmission frequency and the second transmission frequency are different. In this case, the frequency hopping pattern may define (or specify or indicate) the first transmission frequency and the second transmission frequency. Alternatively, the frequency hopping pattern may indicate the first transmission frequency or a frequency distance (transmission frequency hop) between the first transmission frequency and the second transmission frequency. Obviously, the frequency hopping pattern may also only indicate the frequency distance (transmission frequency hop) between the first transmission frequency and the second transmission frequency.

In embodiments, the time hopping pattern may indicate a succession of transmission times or transmission time intervals with which the sub-data packets are to be transmitted.

For example, a first sub-data packet may be transmitted at a first transmission time (or in a first transmission time slot) and a second sub-data packet may be transmitted at a second transmission time (or in a second transmission time slot), wherein the first transmission time and the second transmission time are different. The time hopping pattern may define (or specify or indicate) the first transmission time and the second transmission time. Alternatively, the time hopping pattern may indicate the first transmission time or a temporal distance between the first transmission time and the second transmission time. Obviously, the time hopping pattern may also only indicate the temporal distance between the first transmission time and second transmission time.

A time/frequency hopping pattern may be the combination of a frequency hopping pattern and a time hopping pattern, i.e. a succession of transmission times or transmission time intervals with which the sub-data packets are transferred, wherein transmission frequencies (or transmission frequency hops) are assigned to the transmission times (or transmission time intervals).

In embodiments, the core sub-data packets 140_1 to 140_n and the extension sub-data packets 142_1 to 142_m may be transferred with separate time hopping patterns and/or frequency hopping patterns.

In embodiments, the data transmitter 100 may comprise a transmission unit (transmitter) 102 configured to transmit the data 120. The transmission unit 102 may be connected to an antenna 104 of the data transmitter 100. The data transmitter 100 may further comprise a reception unit (receiver) 106 configured to receive data. The reception unit may be connected to the antenna 104 or a further (separate) antenna of the data transmitter 100. The data transmitter 100 may also comprise a combined transmission/reception unit (transceiver).

The data receiver 110 may comprise a reception unit (receiver) 116 configured to receive the data 120. The reception unit 116 may be connected to an antenna 114 of the data receiver 110. The data receiver 110 may further comprise a transmission unit (transmitter) 112 configured to transmit data. The transmission unit 112 may be connected to the antenna 114 or a further (separate) antenna of the data receiver 110. The data receiver 110 may also comprise a combined transmission reception unit (transceiver).

In embodiments, the data transmitter 100 may be a sensor node, while the data receiver 110 may be a base station. Obviously, it is also possible for the data transmitter 100 to be a base station, while the data receiver 110 is a sensor node. It is further possible that the data transmitter 100 and the data receiver 110 are sensor nodes. In addition, it is possible that the data transmitter 100 and the data receiver 110 are base stations.

In embodiments, the data to be transmitted may be split into two parts, the so-called core information, which may already be processed before receiving the total packet, and the extension information. If the information is channel-coded and assigned (or mapped), it yields the core word and the extension word, respectively, as is shown in FIG. 2.

Figure 2:
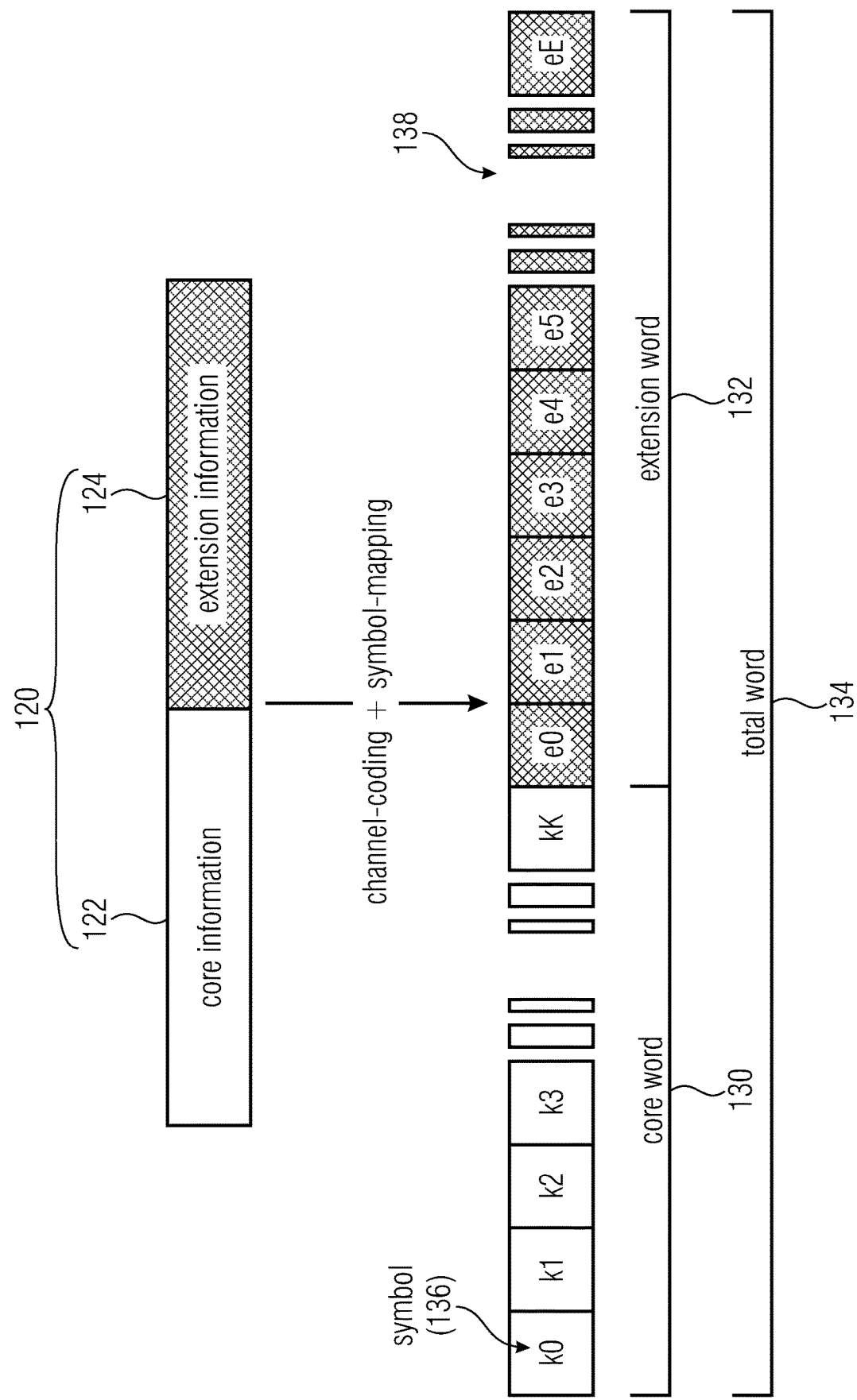
FIG. 2 shows a schematic view of a channel-coding and symbol-mapping of data.

FIG. 2 shows in detail a schematic view of channel-coding and symbol-mapping of data. As can be seen in FIG. 2, the data 120 may comprise core information (core data) 122 and extension information (extension data) 124. Channel-coding and symbol-mapping the core information 122 may yield a core word 130 having the symbols k0 to kK (core symbols 136). Channel-coding and symbol-mapping the extension information 124 may yield an extension word 132 having the symbols e0 to eE (extension symbols 138). The core word 130 and the extension word 132 may form a total word 134. In other words, FIG. 2 shows the formation of the total word 134 from the core information 122 and extension information 124.

Selectively interleaving the core words 130, as is described herein, is especially important if interferences arise in the channel. In this case, it is an advantage if the total data packet to be transferred is split into smaller partial packets, so-called sub-packets (cf. DE 10 2011 082 098 B4). If the temporal distance between sub-packets is large enough in comparison to the interferes occurring in the channel, there is a high probability that only one sub-packet is interfered with. Now, if the data is suitably interleaved, the loss of the information of a sub-packet does not result in the loss of the information. In order to achieve this, channel-coding may be applied to the information before the same is divided into sub-packets.

After channel-coding, the symbols may be mapped (or assigned) to the transmission alphabet of the transfer method. The resulting words are referred to as core word and extension word, respectively.

These words then form a total word 134 which is then divided into sub-packets. Now, the core word may be interleaved into the transfer word such that it may be evaluated at the receiver as early as possible, as is shown in FIG. 3.

Figure 3:
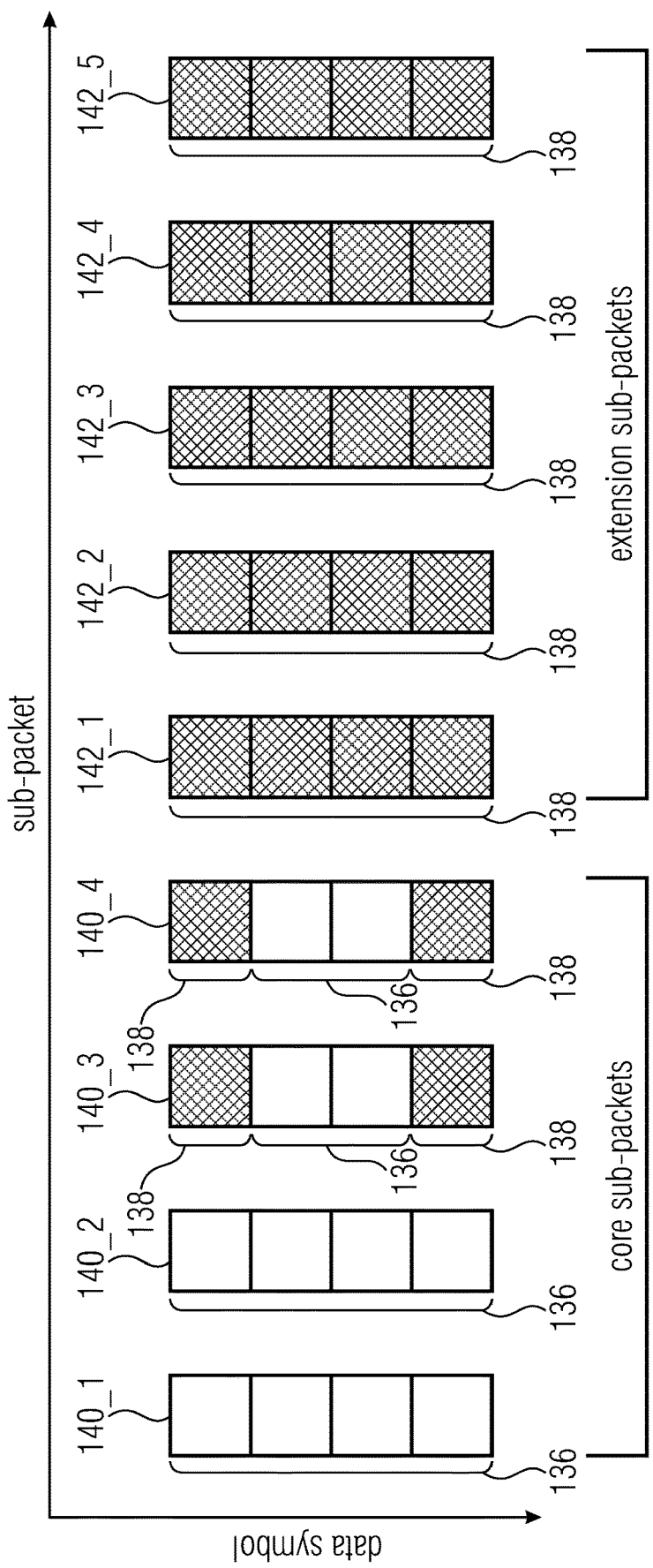
FIG. 3 shows in a diagram a division of the core data and extension data into core sub-data packets and extension sub-data packets.

In detail, FIG. 3 shows in a diagram a division of the core data 122 and extension data 124 in core sub-data packets 140_1 to 140_4 and extension sub-data packets 142_1 to 142_5. Here, the abscissa describes a temporal arrangement of the sub-data packets (core sub-data packets 140_1 to 140_4+extension sub-data packet 142_1 to 142_5), while the ordinate describes a temporal arrangement of the symbols (core symbols+extension symbols) in the respective sub-data packets.

As can be seen in FIG. 3, the core word 130 may be distributed to the core data packets 140_1 to 140_4. In detail, the symbols 136 of the core word 130 may be distributed in an interleaved manner to the core sub-data packets 140_1 to 140_4. Similarly, the extension word 132 may be distributed to the extension sub-data packets 142_1 to 142_5. In detail, the symbols 138 of the extension word 132 may be distributed in an interleaved manner to the extension sub-data packets 142_1 to 142_5.

As can further be seen in FIG. 3, the extension word 132 (or in detail: the extension symbols 138) may be distributed to the core data packets 140_1 to 140_4 and to the extension sub-data packets 142_1 to 142_5. In particular, this is possible if the core sub-data packets 140_1 to 140_4 are not completely filled by the core word 130 (or in detail: the core symbols 136). In this case, the extension word 132 may be distributed to the core data packets 140_1 to 140_4 and to the extension sub-data packets 142_1 to 142_5.

In other words, FIG. 3 shows that the core sub-packets 140_1 to 140_4 contain the core symbols 136. The extension sub-packets 142_1 to 142_5 do not contain any core symbols 136. Therefore, the sub-packets may be classified in two different categories. First: the core sub-packets 140_1 to 140_4. These are the sub-packets 140_1 to 140_4 containing the symbols 136 of the core word 130. Second: the extension sub-packets 142_1 to 142_5. These are the sub-packets 142_1 to 142_5 that do not contain any symbols of the core word 130. A traditional transfer (i.e. without sub-packets) may be achieved if the sub-packets are transferred without a temporal distance.

In the following, detailed embodiments of the above-presented transfer method which may be performed by the data transmitter 100 and the data receiver 110 are explained in more detail.

First Detailed Embodiment: Interleaving the Core Data onto Core Sub-Packets

The core word 132, e.g. which may contain important side information for the reception, may here be completely interleaved into the so-called core sub-data packets 140_1 to 140_n which may be evaluated by the receiver 110 before the completed reception of the extension sub-packets 142_1 to 142_1 to 142_m. The number n of the core sub-packets 140_1 to 140_n has to be known to the receiver 110.

In this case, it is important that the loss of one or several of the core sub-packets 140_1 to 140_n, e.g. through interference, may be compensated. For this, the symbols of the core data 122 may be evenly distributed across the core sub-packet since the loss of a larger continuous block in the data leads to a quick failure for many channel-coding methods.

The simplest approach for this is to interleave the symbols successively into the sub-packets of the core sequence (core sub-data packets 140_1 to 140_n). If the number n of the core sub-packets 140_1 to 140_n is reached, the assignment starts anew. The number of the sub-packets in the core sequence is identical and given, i.e. fixedly specified, for all telegrams of variable lengths.

Figure 4:
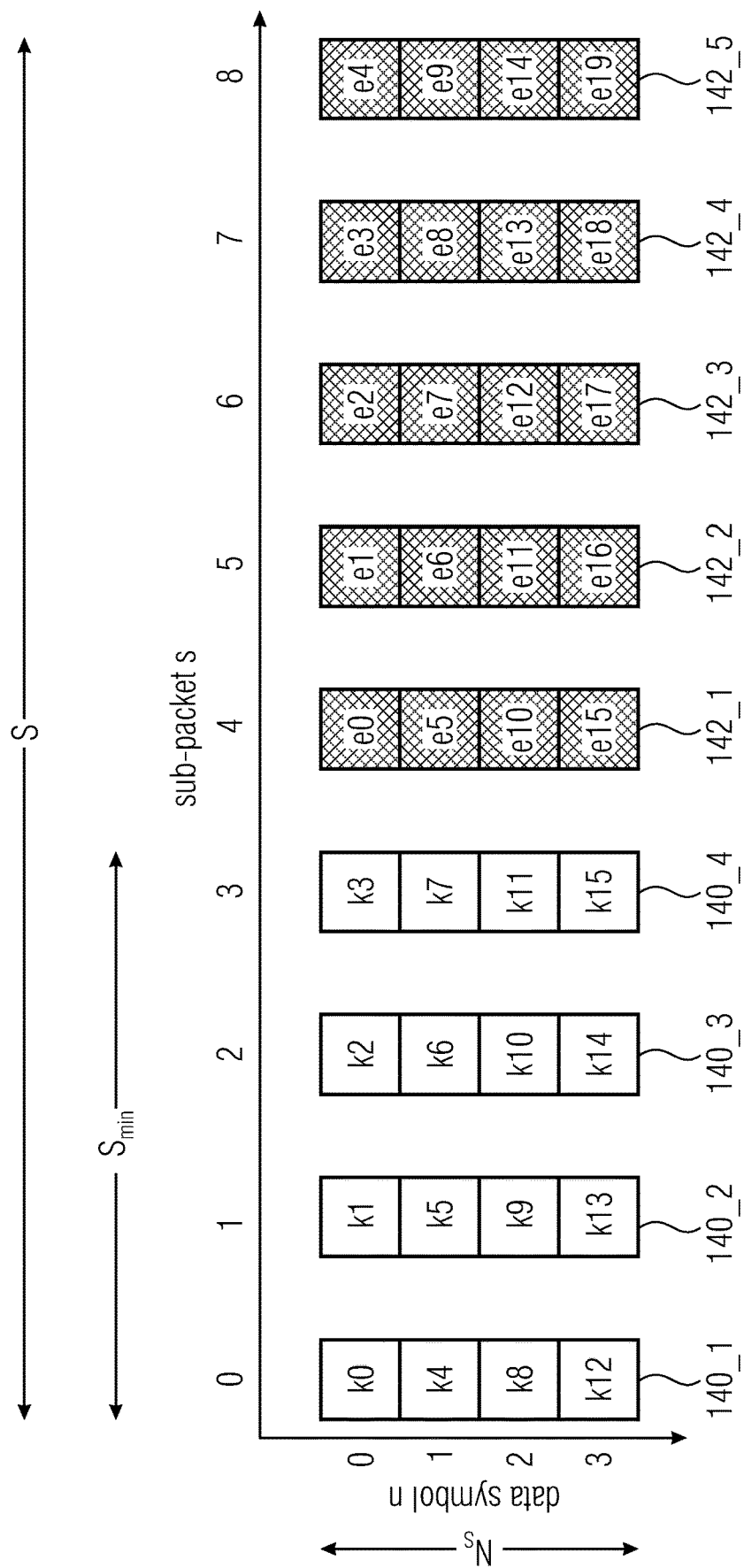
FIG. 4 shows in a diagram a division of the core symbols and extension symbols into core sub-data packets and extension sub-data packets.

FIG. 4 shows in a diagram a division of the core symbols k0 to k15 and extension symbols e0 to e19 into the core sub-data packets 140_1 to 140_4 and extension sub-data packets 142_1 to 142_5. Here, the abscissa describes a temporal arrangement of the sub-data packets (core sub-data packets 140_1 to 140_4+extension sub-data packets 142_1 to 142_5), while the ordinate describes a temporal arrangement of the symbols (core symbols+extension symbols) in the respective sub-data packets.

As can be seen in FIG. 4, the core symbols k0 to k15 may be successively distributed in an interleaved manner to the core sub-data packets 140_1 to 140_4, while the extension symbols e0 to e19 are successively distributed in an interleaved manner to the extension sub-data packets 142_1 to 142_m. In detail, first the core symbols k0 to k15 may be distributed in an interleaved manner to the core sub-data packets 140_1 to 140_4 so that the loss of one of the core sub-data packets 140_1 to 140_3 does not lead to the total loss of the decoding possibility. For example, the first core sub-data packet 140_1 may contain the core symbols k0, k4, k8 and k12, the second core sub-data packet 140_2 may contain the core symbols k1, k5, k9, k13, the third core sub-data packet 140_3 may contain the core symbols k2, k6, k10 and k14, and the fourth core data packet 140_4 may contain the core symbols k3, k7, k11 and k15.

In other words, FIG. 4 shows an exemplary division of the core symbols/extension symbols with $n=S_{min}=4$ core sub-packets, $m=S-S_{min}=5$ extension sub-packets 142_1 to 142_m with a number of symbols per sub-packet of $N_S=4$.

In the example shown in FIG. 4, $N_K=16$ core symbols k0 to k15 are exemplarily interleaved onto $n=S_{min}=4$ core sub-data packets 140_1 to 140_4.

For example, the symbols may be interleaved as follows:
$0^{th}$ symbol into $0^{th}$ core sub-packet
$1^{st}$ symbol into $1^{st}$ core sub-packet 3$^{rd}$ symbol into 3$^{rd}$ core sub-packet
4$^{th}$ symbol into 0$^{th}$ core sub-packet
5$^{th}$ symbol into 1$^{st}$ core sub-packet
. . .
15$^{th}$ symbol into 4$^{th}$ core sub-packet This is only an example, interleaving may fundamentally be done in any way; however, some types of interleaving will lead to a worse performance with the loss of sub-packets.

In embodiments, the information may be interleaved into sub-packets such that the core word may be received separately and before the extension word.

In embodiments, the symbols may be interleaved within the core and/or extension sub-packets such that the loss of one or several core sequence sub-packets does not lead to the total loss of the decoding possibility.

Second Detailed Embodiment: Filling the Core Sub-Packets with Extension Symbols for a Variable Number of Sub-Packets Usually, the number of symbols that may be transmitted in the core sub-packets 140_1 to 140_n is larger than the number of the symbols in the core word 130 so that the core sub-packets 140_1 to 140_n may be filled with symbols from the extension word 132. For this to take place as evenly as possible, the ratio of core symbols in the core sub-packets ($N_K$) and extension symbols in the core sub-packet ($N_S$–$N_K$) may be specified before interleaving. This ratio $$V = \frac{N_K}{N_S - N_K}$$

may be an integer divisor of the number of core sub-packets ($S_{min}$), and the number of the core symbols in a sub-packet may be larger than or equal to the number of the extension symbols in a sub-packet, i.e. $\frac{N_K}{N_S} \geq 1$.

If the core word 130 and the extension word 132 are now distributed to the telegram, the core word is distributed into the first free data symbols of the core sub-packets.

The first $$\frac{S_{min}}{V}$$

symbols of the extension word 132 are then distributed to the core sub-packets 140_1 to 140_n. This assignment may take place evenly so that two of these symbols are not placed into the same sub-packet.

There are several possibilities for this. First: the symbols may be placed into the core sub-packets in the distance V. In the first pass, this process starts at the sub-packet 0 and continues forward in V steps. The second symbol may therefore be placed into sub-packet V, etc. Second: the symbols may be placed in V blocks into the core sub-packets. The $$\frac{S_{min}}{V}$$

symbols occupy $$S - S_{min} + \frac{S_{min}}{V}$$

successive core sub-packets, if the core sub-packet index exceeds $S_{min}$, the process is started again at the core sub-packet 0.

The next S–$S_{min}$ extension symbols may then be distributed to the sub-packets of the extension sequence without an additional distance. Thus, they start at sub-packet $S_{min}$ and end at S.

If $$\frac{S_{min}}{V}$$

extension symbols have been distributed, the process starts with placing the next $$\frac{S_{min}}{V}$$

extension symbol at the sub-packet 1 (142_2) and continues forward in V steps. Thus, the next symbol is placed into sub-packet V+1, etc. until the $$\frac{S_{min}}{V}$$

symbols are placed. The placement of the extension symbols within the extension sequence remains as in the first step.

If an extension symbol has been assigned to each sub-packet of the core sequence, the next assignment round starts again at the sub-packet 0 (140_1) and the method is continued up to the end of the extension symbols.

Figure 5:
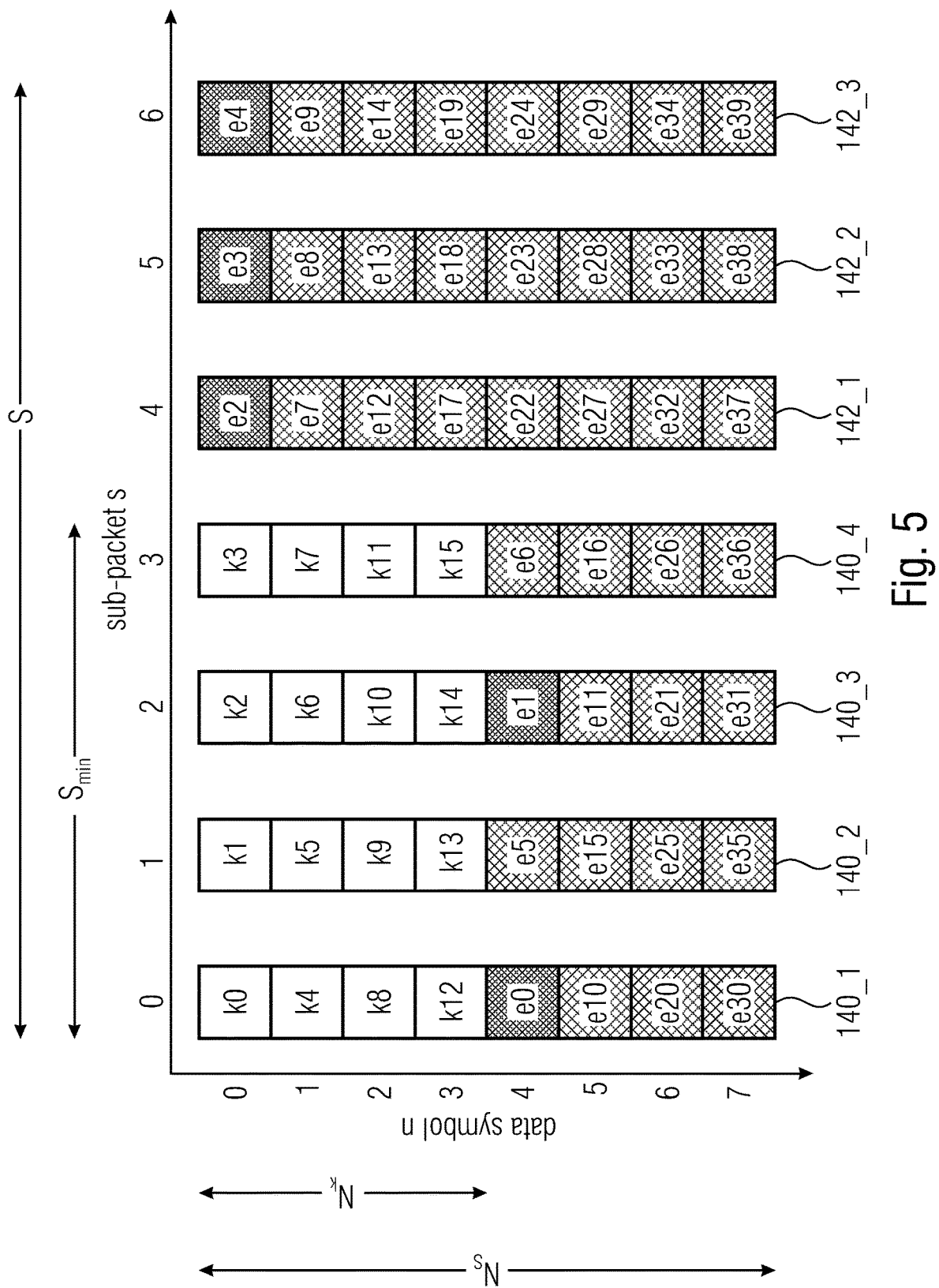
FIG. 5 shows in a diagram a division of the core symbols and extension symbols into core sub-data packets and extension sub-data packets after a first intermediate result of filling.

FIG. 5 shows in a diagram a division of the core symbols k0 to k15 and extension symbols e0 to e39 into the core sub-data packets 140_1 to 140_4 and extension sub-data packets 142_1 to 142_3 after a first intermediate result of filling. In this case, the abscissa describes a temporal arrangement of the sub-data packets (core sub-data packet 140_1 to 140_4+extension sub-data packets 142_1 to 142_3), while the ordinate describes a temporal arrangement of the symbols (core symbols+extension symbols) in the respective sub-data packets.

As can be seen in FIG. 5, the core symbols k0 to k15 may first be distributed in an interleaved manner to the core sub-data packets 140_1 to 140_4 so that the loss of one or several of the core sub-data packets 140_1 to 140_3 does not lead to a total loss of the decoding possibility. In detail, the first core sub-data packet 140_1 may contain the core symbols k0, k4, k8 and k12, the second core sub-data packet 140_2 may contain the core symbols k1, k5, k9, k13, the third core sub-data packet 140_3 may contain the core symbols k2, k6, k10 and k14, and the fourth core data packet 140_4 may contain the core symbols k3, k7, k11 and k15.

Subsequently, the extension symbols e0 to e39 may be distributed in an interleaved manner to the core sub-data packets 140_1 to 140_4 and to the extension sub-data packets so that the core sub-data packets 140_1 to 140_4 and the extension sub-data packets 142_1 to 142_3 are evenly filled and so that the loss of one of the sub-data packets does not lead to the total loss of the decoding possibility.

It is the goal that the first core sub-data packet 140_1 contains the extension symbols e0, e10, e20 and e30, the second core sub-data packet 140_2 contains the extension symbols e5, e15, e25 and e35, the third core sub-data packet 140_3 contains the extension symbols e1, e11, e21 and e31, the fourth core sub-data packet 140_4 contains the extension symbols e6, e16, e26 and e36, the first extension sub-data packet 142_1 contains the extension symbols e2, e7, e12, e17, e22, e27, e32, e37, the second extension sub-data packet 142_2 contains the extension symbols e3, e8, e13, e18, e23, e28, e33 and e38, and the third extension sub-data packet 142_3 contains the extension symbols e4, e9, e14, e19, e24, e29, e34 and 39.

For this, the extension symbol e0 may first be distributed to the first core sub-data packet 140_1, the extension symbol e1 may be distributed to the third core sub-data packet 140_3, the extension symbol e2 may be distributed to the first extension sub-data packet 142_1, the extension symbol e3 may be distributed to the second extension sub-data packet 142_2 and the extension symbol e3 may be distributed to the third extension sub-data packet 142_3.

In other words, FIG. 5 shows the placement of the extension symbols e0 and e1 with a distance V=2 into the core sub-packets starting at the core sub-packet 0, wherein the symbols e2, e3 and e4 are interleaved into the extension sub-packets.

Figure 6:
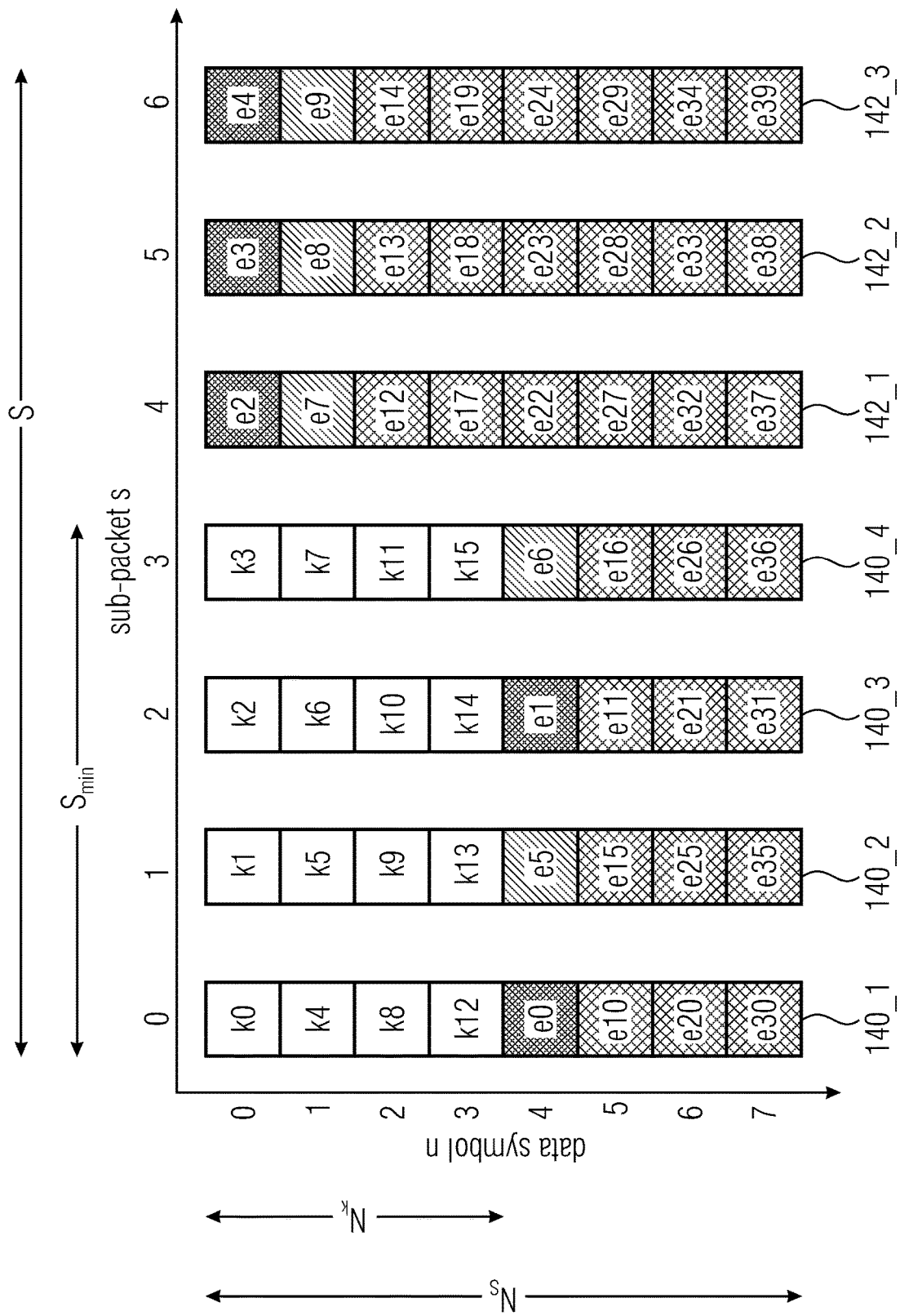
FIG. 6 shows in a diagram a division of the core symbols and extension symbols into core sub-data packets and extension sub-data packets after a second intermediate result of filling.

FIG. 6 shows in a diagram a division of the core symbols k0 to k15 and extension symbols e0 to e39 into the core sub-data packets 140_1 to 140_4 and extension sub-data packets 142_1 to 142_3 after a second intermediate result of filling. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols) in the respective sub-data packets.

As can be seen in FIG. 6, the extension symbol e5 may now be distributed to the second core sub-data packet 140_2, the extension symbol e6 may be distributed to the fourth core sub-data packet 140_4, the extension symbol e7 may be distributed to the first extension sub-data packet 142_1, the extension symbol e8 may be distributed to the second extension sub-data packet 142_2 and the extension symbol e9 may be distributed to the third extension sub-data packet 142_3.

In other words, FIG. 6 shows the placement of the extension symbols e5 and e6 with a distance of V=2 into the core sub-packets starting at the core sub-packet 1, wherein the symbols e7, e8 and e9 are interleaved into the extension sub-packets.

Figure 7:
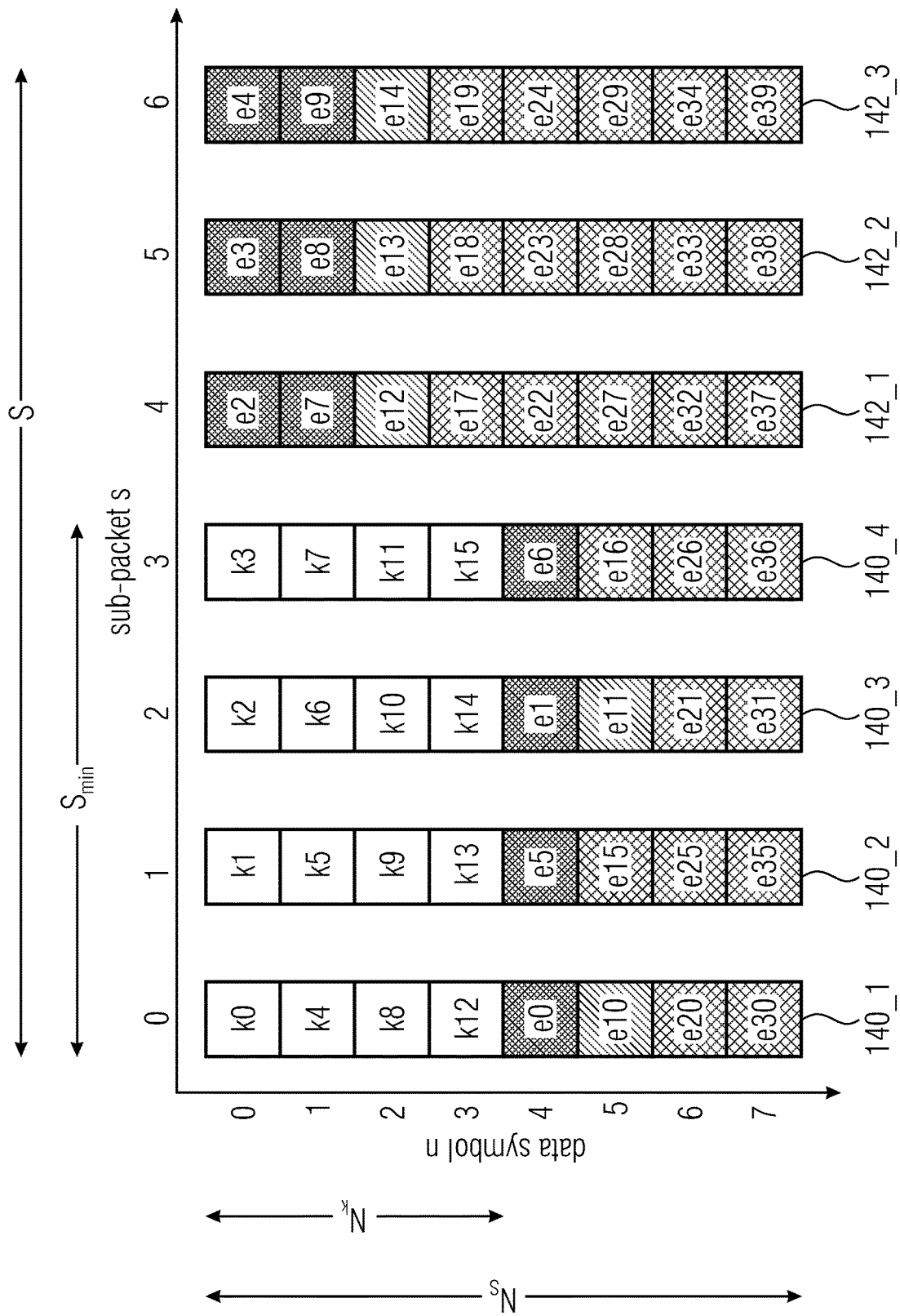
FIG. 7 shows in a diagram a division of the core symbols and extension symbols into core sub-data packets and extension sub-data packets after a third intermediate result of filling.

FIG. 7 shows in a diagram a division of the core symbols k0 to k15 and extension symbols e0 to e39 into the core sub-data packets 140_1 to 140_4 and extension sub-data packets 142_1 to 142_3 after a third intermediate result of filling. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols) in the respective sub-data packets.

As can be seen in FIG. 7, the extension symbol e10 may now be distributed to the first core sub-data packet 140_1, the extension symbol e11 may be distributed to the third core sub-data packet 140_3, the extension symbol e12 may be distributed to the first extension sub-data packet 142_1, the extension symbol e13 may be distributed to the second extension sub-data packet 142_2 and the extension symbol e14 may be distributed to the third extension sub-data packet 142_3.

In other words, FIG. 7 shows the placement of the extension symbols e10 and e11 with a distance V=2 into the core sub-packets starting at core sub-packet 0, wherein the symbols e12, e13 and e14 are interleaved into the extension sub-packets.

Figure 8:
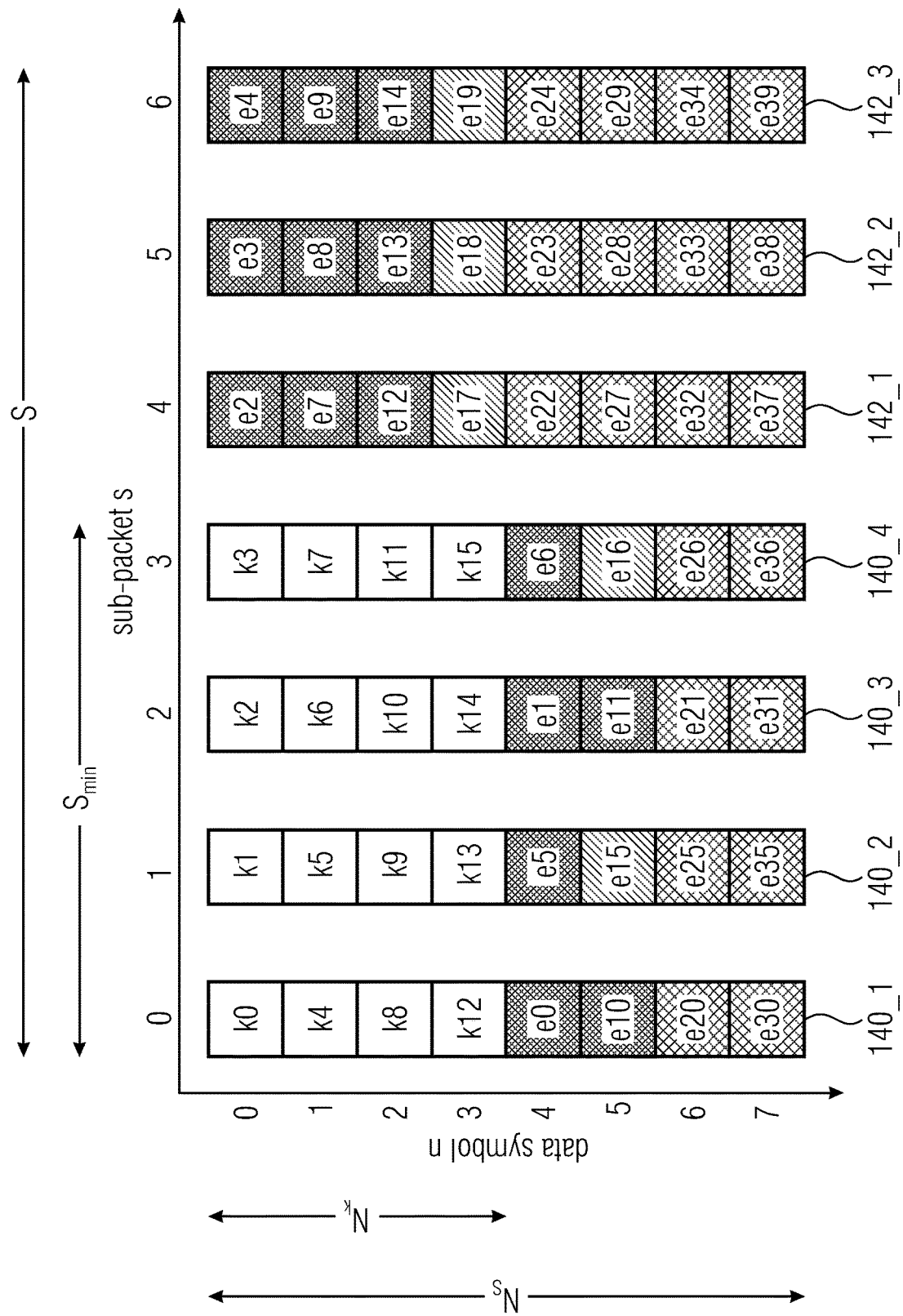
FIG. 8 shows in a diagram a division of the core symbols and extension symbols into core sub-data packets and extension sub-data packets after a fourth intermediate result of filling.

FIG. 8 shows in a diagram a division of the core symbols k0 to k15 and extension symbols e0 to e39 into the core sub-data packets 140_1 to 140_4 and extension sub-data packets 142_1 to 142_3 after a fourth intermediate result of filling. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols) in the respective sub-data packets.

As can be seen in FIG. 8, the extension symbol e15 may now be distributed to the second core sub-data packet 140_2, the extension symbol e16 may be distributed to the fourth core sub-data packet 140_4, the extension symbol e17 may be distributed to the first extension sub-data packet 142_1, the extension symbol e18 may be distributed to the second extension sub-data packet 142_2 and the extension symbol e19 may be distributed to the third extension sub-data packet 142_3.

In other words, FIG. 8 shows the placement of the extension symbols e15 and e16 with a distance V=2 into the core sub-packets starting at the core sub-packet 1, wherein the symbols e17, e18 and e19 are interleaved into the extension sub-packets.

The above steps may be continued until all symbols are distributed.

In embodiments, the extension symbols may be interleaved into core sub-packets so that the overall number of sub-packets is evenly filled.

Embodiments enable, or support, a variable number of sub-packets.

Third Detailed Embodiment: Channel-Coding of Core Information and Extension Information Together In some channel codes (e.g. turbo codes), the performance may be increased if the input length of the data (block size) increases. This fact is described in detail in [Sam Dolinar, Dariush Divsalar, and Fabrizio Pollara, "Turbo Code Performance as a Function of Code Block Size", 1998 IEEE International Symposium on Information Theory].

In addition, [G. Kilian, M. Breiling, H. H. Petkov, H. Lieske, F. Beer, J. Robert, and A. Heuberger, "Increasing Transmission Reliability for Telemetry Systems Using Telegram Splitting," IEEE Transactions on Communications, vol. 63, no. 3, pp. 949-961, March 2015.] shows that the decoding probability in the interference channel increases with a rising number of partial packets. If only a few symbols are transferred into the extension word in addition to the core word, accordingly few sub-packets have to be attached to the core sub-packets.

Through the above-described effects, the decoding probability strongly decreases with short extension information and core information, respectively, if channel-coding is separately performed for the two.

In order to counteract the two effects, channel code may be calculated across the entire information, i.e. core information and extension information.

In embodiments, a transfer reliability of short core information and extension information may be increased by mutual channel-coding.

Fourth Detailed Embodiment: Securing the Decodability of the Core Information by Inserting Extension Symbols For graph-based decoders without defined start or end states, e.g. Viterbi convolution decoders (with tailbiting), the first received symbols may only be decoded with a low reliability since there is not a sufficient amount of data for determining the best path. However, the core information is essential for the reception and it should therefore be possible to decode it with a high reliability. In order to solve this problem, a corresponding amount of data of the extension information may be placed in front of the core information (usually (typically) the length of the influence length of the code) so that it is possible to reliable decode the core information.

Figure 9:
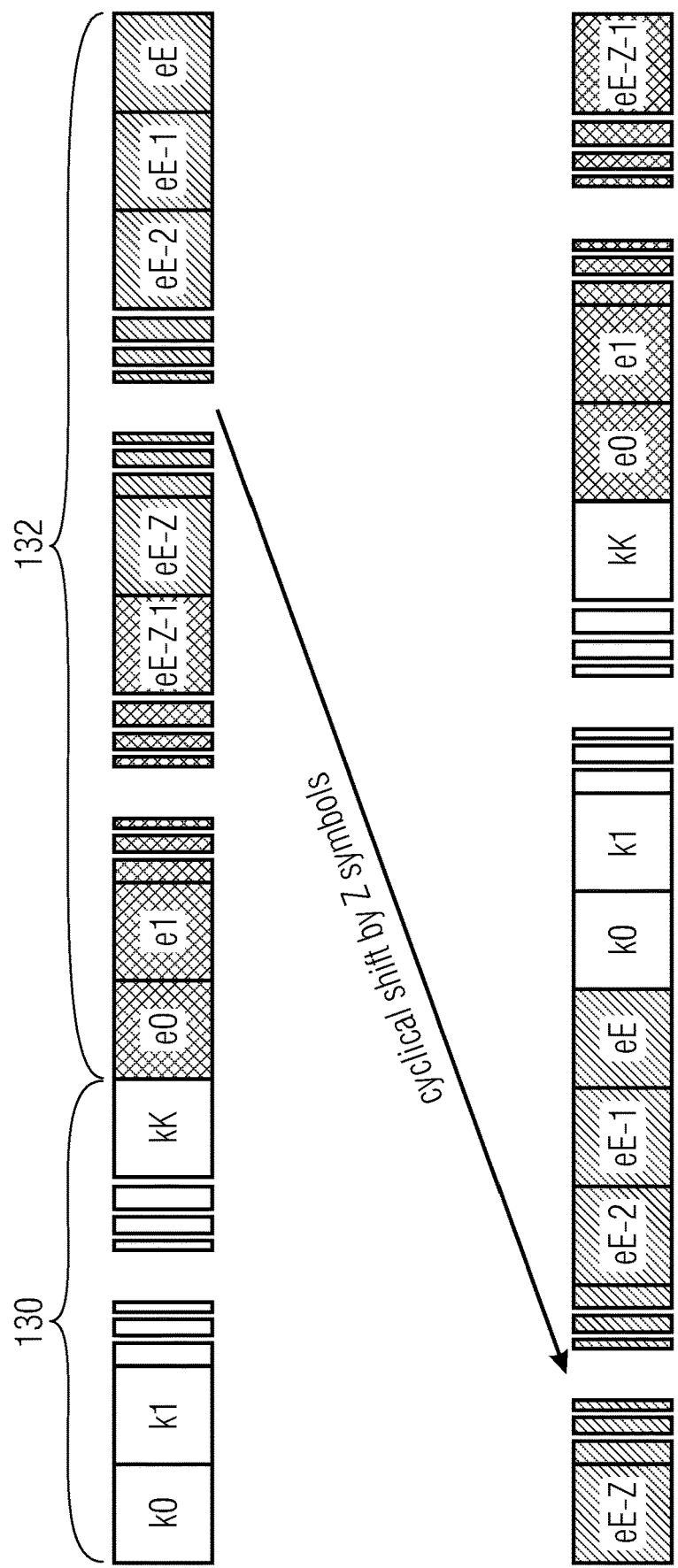
FIG. 9 shows a schematic view of a cyclical shift of the total word after channel-coding so that symbols of the extension word are arranged in front of the core word.

For example, this may be achieved by shifting in a cyclical manner, after channel-coding, the total word having a core word part placed in front by the number of the symbols which originate from the extension part, as is shown in FIG. 9.

In detail, FIG. 9 shows a schematic view of a cyclical shift of the total word after the channel-coding so that Z symbols of the extension word 132 are arranged in front of the core 130.

As can be seen in FIG. 9, the core word 130 includes K+1 symbols e0 to eK after the channel-coding, wherein the extension word 132 includes E+1 symbols e0 to eE after the channel-coding. Z symbols may be taken from the E+1 symbols e0 to eE of the extension word 132 and may be placed in front of the K+1 symbols e0 to eK of the core word 130. For example, the last Z symbols e-Z to eE of the extension word 132 may be taken and be placed in front of the K+1 symbols e0 to eK of the core word 130.

In other words, FIG. 9 shows an example for inserting Z extension symbols (light blue) into the area of the core symbols by cyclically shifting after channel-coding Another possibility would be to shift any other combination of symbols to the start or to take extension information into the core before channel-coding is performed.

In embodiments, the core and the extension may be channel-coded together (cf. third detailed embodiment).

In embodiments, the extension symbols may be used to settle the decoder for the core symbols in order to increase the decodability of the core word.

Fifth Detailed Embodiment: Interleaving the Core Sequence Around Synchronization Symbols Since the core information 122 is very important, it should be possible to estimate and decode the symbols 136 (of the core word 130=channel-coded core information 122) as reliably as possible. In a transfer packet, there are mostly known symbols which are used by the receiver for the synchronization, so-called preamble symbols, or a synchronization sequence. Symbols that are transferred directly before or after the synchronization symbols may be decoded by the decoder with the highest reliability since time or frequency offsets between the transmitter and the receiver have a larger influence with an increasing temporal distance between a symbol to be decoded and the known symbols.

In order to use this effect for the reliability of the correct reception of the core information, it is possible to arrange the core symbols around the synchronization sequences.

Figure 10:
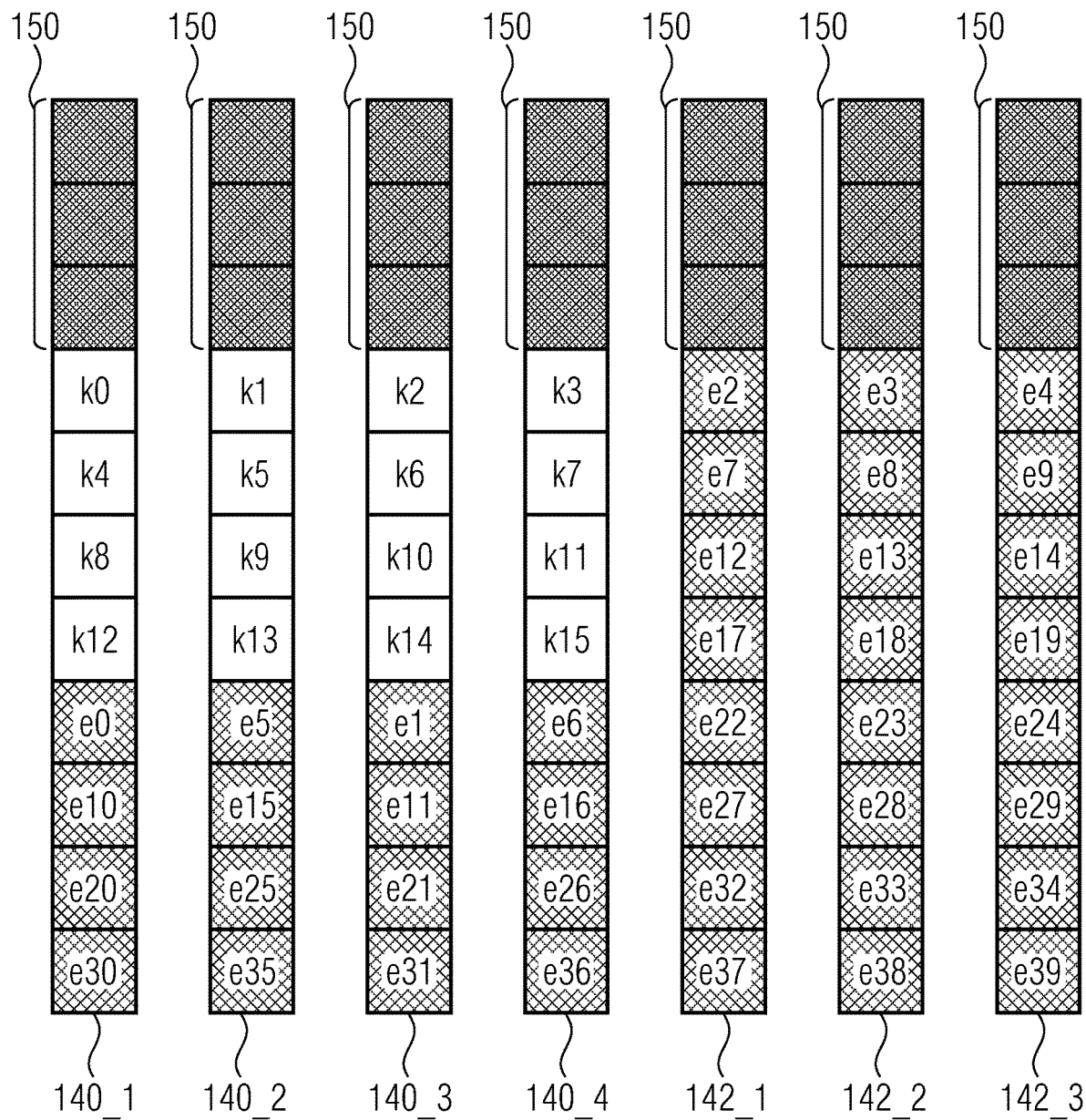
FIG. 10 shows in a diagram a division of the core symbols and extension symbols into core sub-data packets and extension sub-data packets, wherein synchronization symbols in the sub-data packets are placed in front of the core symbols and extension symbols, respectively.

If only a single preamble is used for the entire telegram, all core symbols may be located at the start of the telegram, as is shown in FIG. 10.

In detail, FIG. 10 shows in a diagram a division of the core symbols k0 to k15 and extension symbols e0 to e39 into the core sub-data packets 140_1 to 140_4 and extension sub-data packets 142_1 to 142_3, wherein synchronization symbols 150 are placed in front of the core symbols k0 to k15 and extension symbols e0 to e39, respectively, in the sub-data packets. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols) in the respective sub-data packets.

The division of the core symbols k0 to k15 and extension symbols e0 to e39 into the core sub-data packets 140_1 to 140_4 and extension sub-data packets 142_1 to 142_3 shown in FIG. 10 essentially corresponds to the division described in FIGS. 5 to 8, wherein the synchronization symbols 150 are placed in front of the core symbols k0 to k15 and extension symbols e0 to e39, respectively, in the respective sub-data packets (core sub-data packets 140_1 to 140_4 and extension data packets 142_1 to 142_3).

In other words, FIG. 10 shows the core symbols k0 to k15 in the core sub-packets 140_1 to 140_3 at the beginning of the sub-packets, since the distance to the synchronization symbols 150 increases the estimation accuracy for the core symbols k0 to k15.

For a split transfer of the sub-packets, such as in the telegram splitting method, one synchronization sequence in each sub-packet is advantageous. Here, the core symbols in the core sub-packets are then accordingly shifted close to the preamble, midamble or postamble. The arrangement of the core symbols among themselves within the sub-data packet may be arbitrary. From sub-packet to sub-packet, the core symbols should be arranged such that the distance is maximized. The division into symbols of the core sub-packets or extension sub-packets may then be carried out analogously to the process described in embodiment two.

Figure 11:
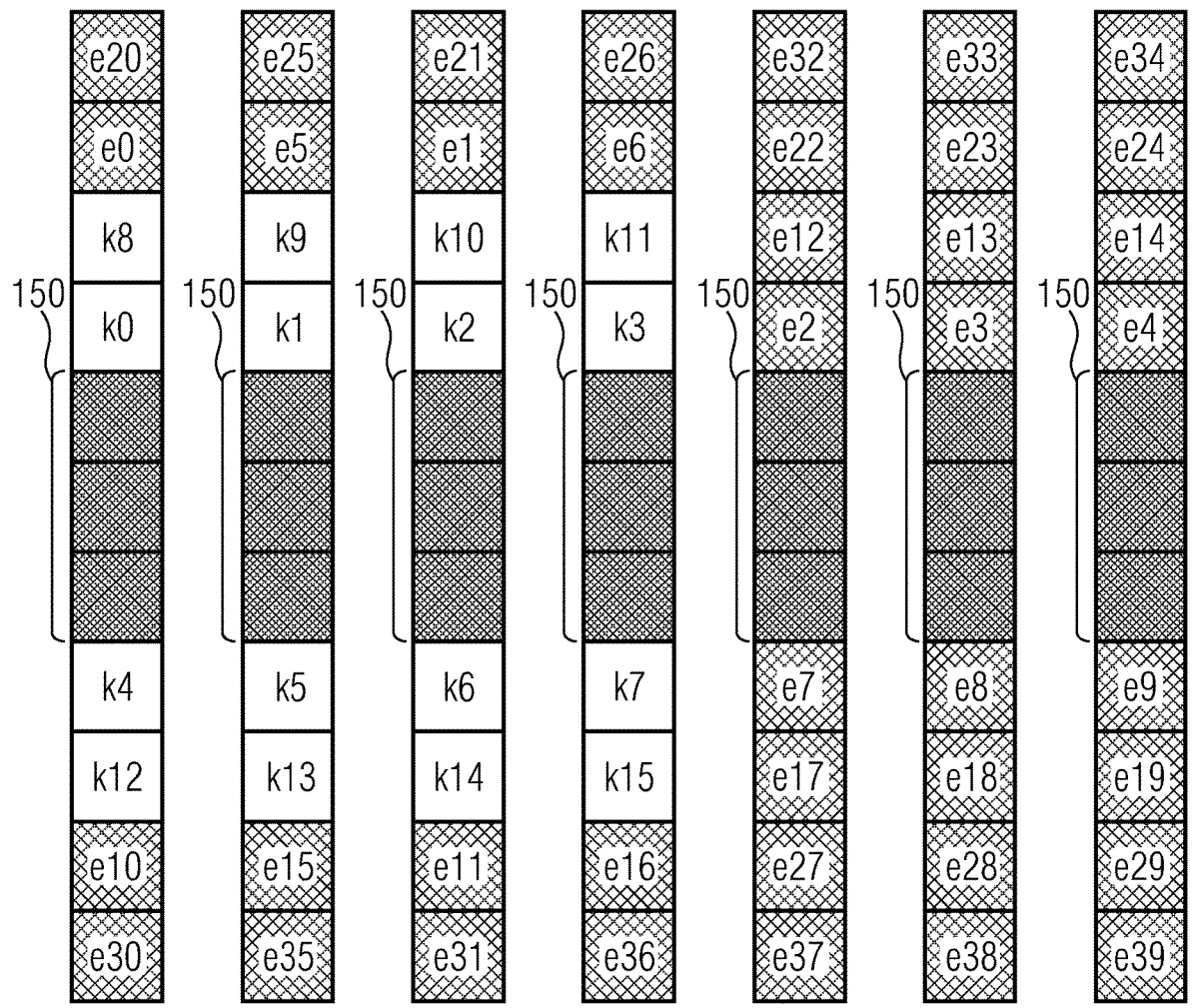
FIG. 11 shows in a diagram a division of the core symbols and extension symbols into core sub-data packets and extension sub-data packets, wherein in the center of the respective sub-data packets synchronization symbols are present between the core symbols and extension symbols, respectively.

FIG. 11 shows in a diagram a division of the core symbols k0 to k15 and extension symbols e0 to e39 into the core sub-data packets 140_1 to 140_4 and extension sub-data packet s142_1 to 142_3, wherein there are synchronization symbols 150 in the middle of the respective sub-data packets between the core symbols k0 to k15 and extension symbols e0 to e39, respectively. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols) in the respective sub-data packets.

The division of the core symbols k0 to k15 and extension symbols e0 to e39 into the core sub-data packets 140_1 to 140_4 and extension sub-data packets 142_1 to 142_3 shown in FIG. 11 essentially corresponds to the division described in FIGS. 5 to 8, wherein, in the respective sub-data packets (core sub-data packets 140_1 to 140_4 and extension data packets 142_1 to 142_3), there are synchronization symbols 150 between the core symbols k0 to k15 and extension symbols e0 to e39, respectively, in the center of the respective sub-data packets.

In other words, FIG. 11 shows core symbols k0 to k15 in the core sub-packets 140_1 to 140_4 arranged around the midamble (preamble arranged in the center of a sub-data packet) since the distance to the synchronization symbols 150 increases the estimation accuracy for the core symbols k0 to k15.

If a telegram or a sub-packet contains several separate synchronization sequences, the core symbols should be arranged around these.

Figure 12:
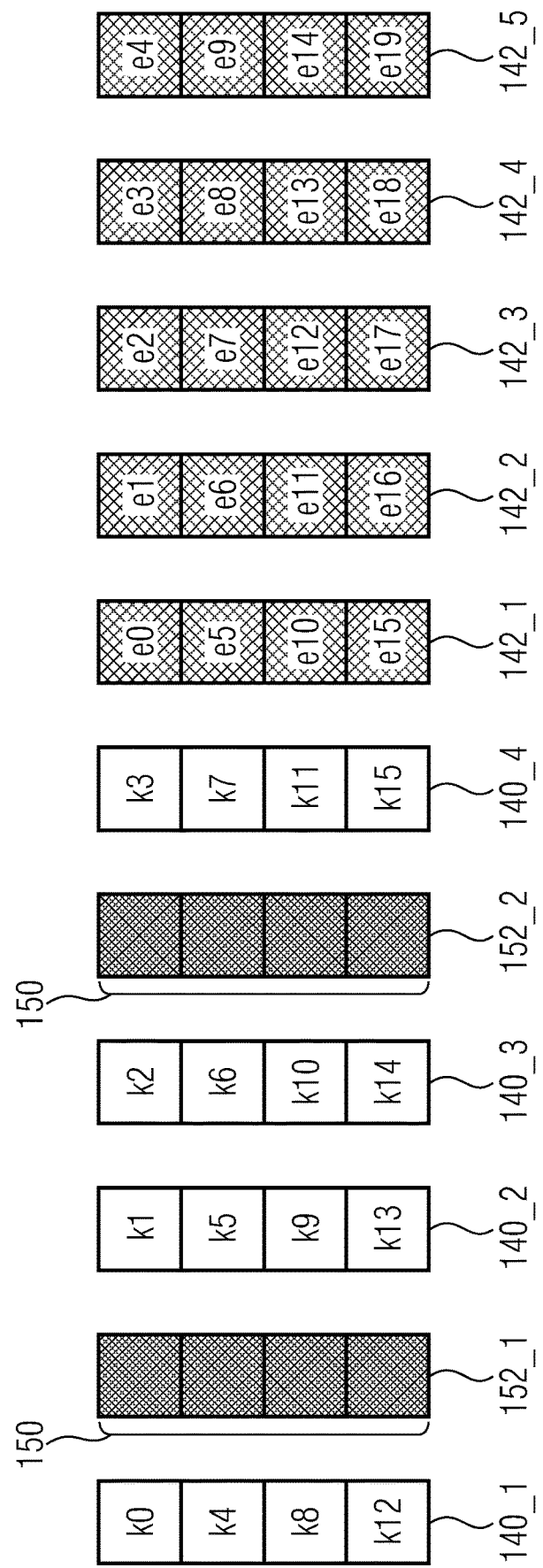
FIG. 12 shows in a diagram a division of the core symbols and extension symbols into core sub-data packets and extension sub-data packets, wherein synchronization sub-data packets with synchronization symbols are arranged between the core sub-data packets.

FIG. 12 shows in a diagram a division of the core symbols k0 to k15 and extension symbols e0 to e19 into the core sub-data packets 140_1 to 140_4 and extension sub-data packets 142_1 to 142_5, wherein synchronization sub-data packets 152_1 and 152_2 having the synchronization symbols 150 are arranged between the core sub-data packets. In this case, the abscissa describes a temporal arrangement of the respective sub-data packets, while the ordinate describes a temporal arrangement of the symbols in the respective sub-data packets.

The division of the core symbols k0 to k15 and extension symbols e0 to e19 into core sub-data packets 140_1 to 140_4 and extension sub-data packets 142_1 to 142_5 shown in FIG. 12 essentially corresponds to the division described in FIG. 4.

As can be seen in FIG. 12, the first synchronization sub-data packet 152_1 may be arranged between the first and second core sub-data packets 140_1 and 140_2, while a second synchronization sub-data packet 152_2 may be arranged between the third and fourth core sub-data packets 140_3 and 140_4.

In other words, FIG. 12 shows the core symbols k0 to k15 in the core sub-packets 140_1 to 140_4 arranged around the two synchronization sub-packets 152_1 and 152_2 followed by the extension sub-packets 142_1 to 142_5.

Figure 13:
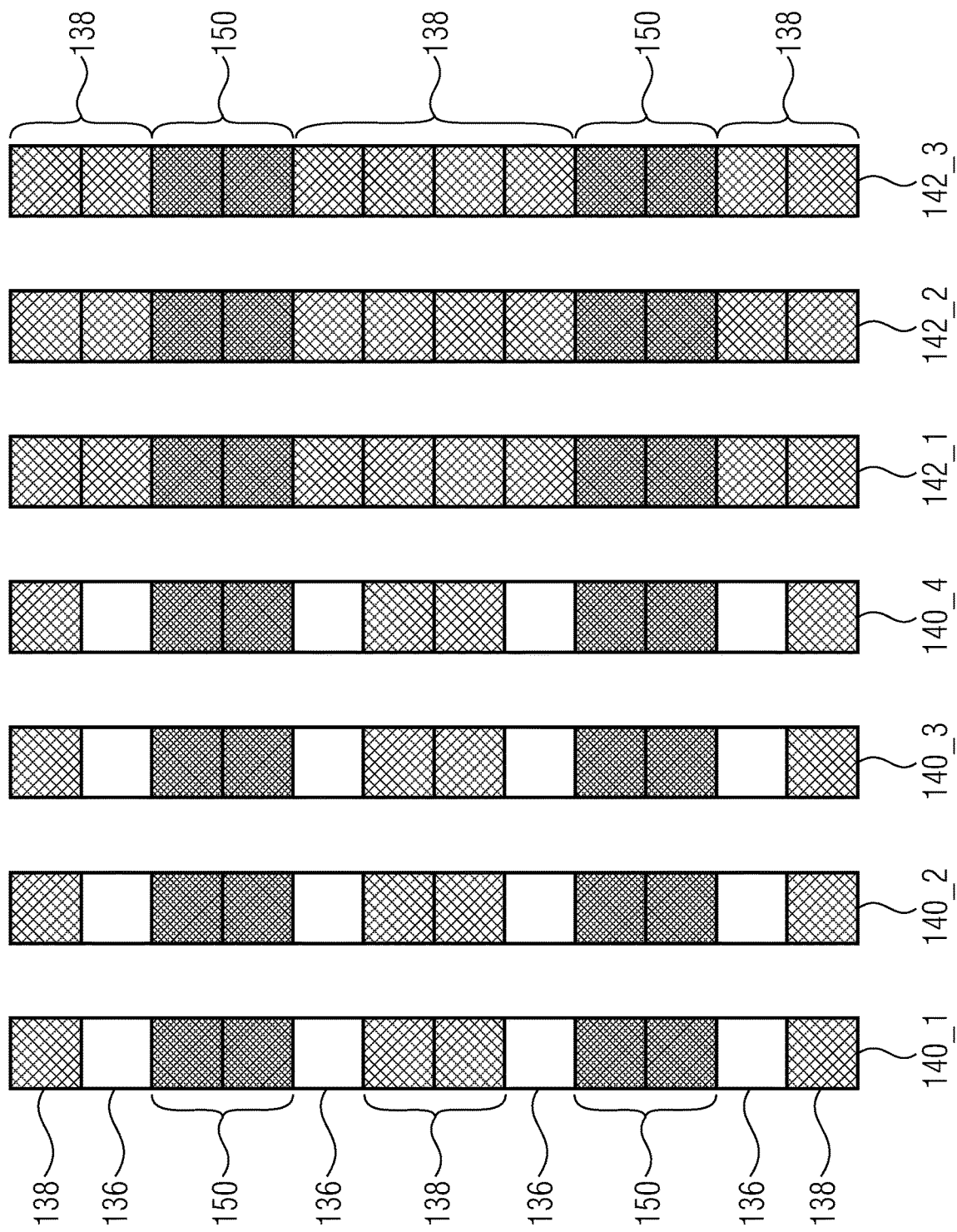
FIG. 13 shows in a diagram a division of the core symbols and extension symbols into core sub-data packets and extension sub-data packets, wherein two spaced apart (partial) synchronization symbol sequences are present in the respective sub-data packets.

FIG. 13 shows in a diagram a division of the core symbols 136 and extension symbols 138 into the core sub-data packets 140_1 to 140_4 and extension sub-data packets 142_1 to 142_3, wherein there are two spaced apart (partial) synchronization symbol sequences in the respective sub-data packets. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols+synchronization symbols 150) in the respective sub-data packets.

As can be seen in FIG. 13, the core symbols 136 may be arranged immediately adjacent to the synchronization symbols 150 in the core sub-data packets 140_1 to 140_4, while the extension symbols 138 may be arranged adjacent to the core symbols 136.

In other words, FIG. 13 shows the core symbols 136 being arranged evenly around two synchronization sequences 150.

In embodiments, the symbols 136 of the core words 130 may be placed as close to the synchronization symbols 150 as possible.

Sixth Detailed Embodiment: Interleaving Around Separated Synchronization Sequences of Different Reliabilities If synchronization sequences of different lengths are used, the reliability of the symbols differs according to the quality of the synchronization sequence. With this, more core symbols may be arranged around the synchronization sequence having a higher quality than around the sequence having a lower quality in order to obtain the same error probability.

Figure 14:
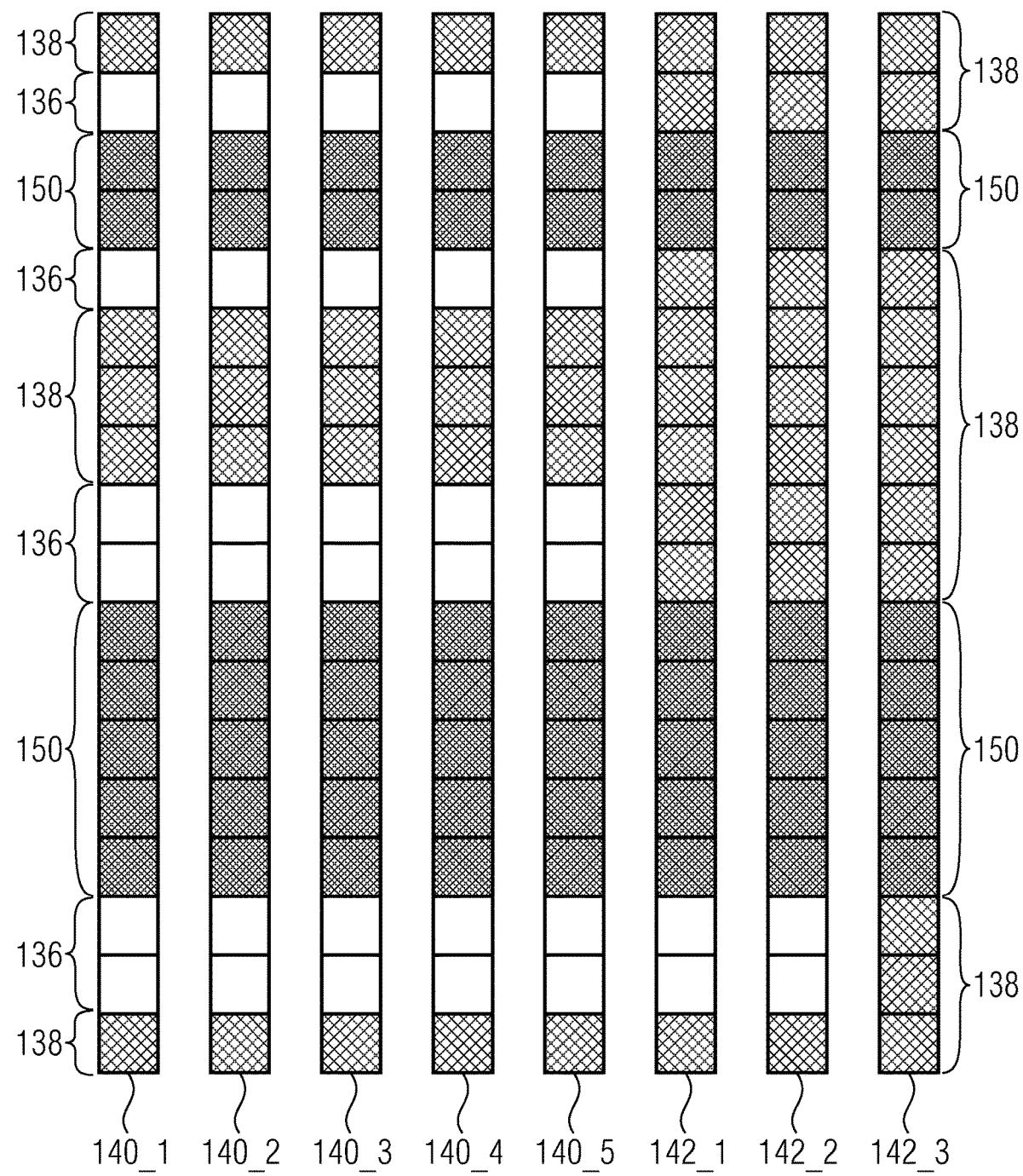
FIG. 14 shows in a diagram a division of the core symbols and extension symbols into core sub-data packets and extension sub-data packets, wherein two spaced apart (partial) synchronization symbol sequences of different lengths are present in the respective sub-data packets.

FIG. 14 shows in a diagram a division of the core symbols 136 and extension symbols 138 into the core sub-data packets 140_1 to 140_5 and extension sub-data packets 142_1 to 142_3, wherein there are two spaced apart (partial) synchronization symbol sequences of different lengths in the respective sub-data packets. In this case, the abscissa describes a temporal arrangement of the sub-data packets (core sub-data packets 140_1 to 140_5+extension sub-data packets 142_1 to 142_3), while the ordinate describes a temporal arrangement of the symbols (core symbols+extension symbols+synchronization symbols 150) in the respective sub-data packets.

As can be seen in FIG. 14, the core symbols 136 may be arranged immediately adjacent to the synchronization symbols 150 in the core sub-data packets 140_1 to 140_5, while the extension symbols 138 may be arranged adjacent to the core symbols 136. Furthermore, more core symbols 136 may be arranged immediately adjacent to the longer (partial) synchronization symbol sequence than to the shorter (partial) synchronization symbol sequence in the core sub-data packets 140_1 to 140_5.

In other words, FIG. 14 shows the core symbols 136 arranged around two synchronization sequences 150, wherein the number of the core symbols 136 enclosing a synchronization sequence 150 may be determined based on the quality of the synchronization sequence 150 (here as an example by means of the length).

In embodiments, the symbols 136 of the core words 130 may be placed as close as possible to the synchronization symbols 150 (cf. fifth detailed embodiment).

In embodiments, the symbols 136 of the core sequence 130 may not be evenly distributed around all synchronization symbol blocks 150, but according to the reliability to be expected in the sub-packet.

Seventh Detailed Embodiment: Interleaving Around a Synchronization with Mutual Channel-Coding of Core Information and Extension Information If the core information and extension information are encoded together (cf. third detailed embodiment), it is advantageous that the symbols 138 of the extension sequence 132, which are used for settling the decoder, are shifted as close as possible to the most reliable positions in the packet, i.e. to the direct surroundings of the preamble.

In embodiments, the extension symbols 138 for settling the decoder (cf. third detailed embodiment) may be placed at the most reliable positions in the packet (cf. fifth detailed embodiment).

Eighth Detailed Embodiment: Re-Encoding the Core Symbols and Use as Synchronization Symbols Since the core information is already available before the complete reception of the entire packet, the information may again be channel-coded and mapped at the receiver. Due to this process, it is then possible to also see the core symbols as synchronization symbols since their values are now known. With this knowledge, the estimation ability and decodability of the extension symbols in the core sub-packets may further be improved.

Ninth Detailed Embodiment: Iteratively Decoding the Extension Word

Based on the eighth detailed embodiment, it is also possible to decode and to re-encode the extension word into small parts after the complete reception in order to increase by means of this iterative decoding the reliability in the estimation of the extension symbols in the sub-packets.

Figure 15:
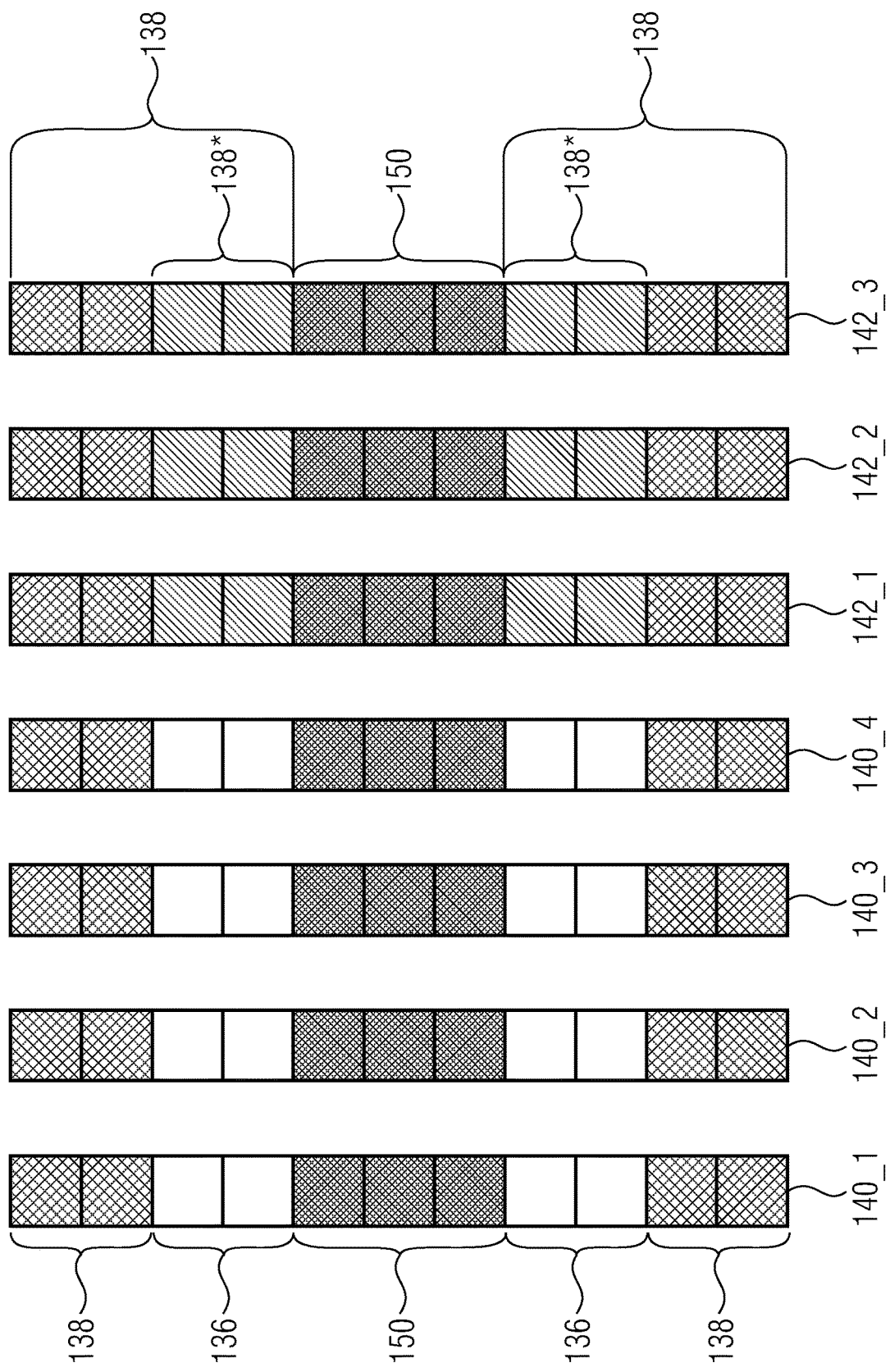
FIG. 15 shows in a diagram a division of the core symbols and extension symbols into core sub-data packets and extension sub-data packets, wherein (partial) synchronization symbols sequences arranged in the center are present in the respective sub-data packets.
Figure 16:
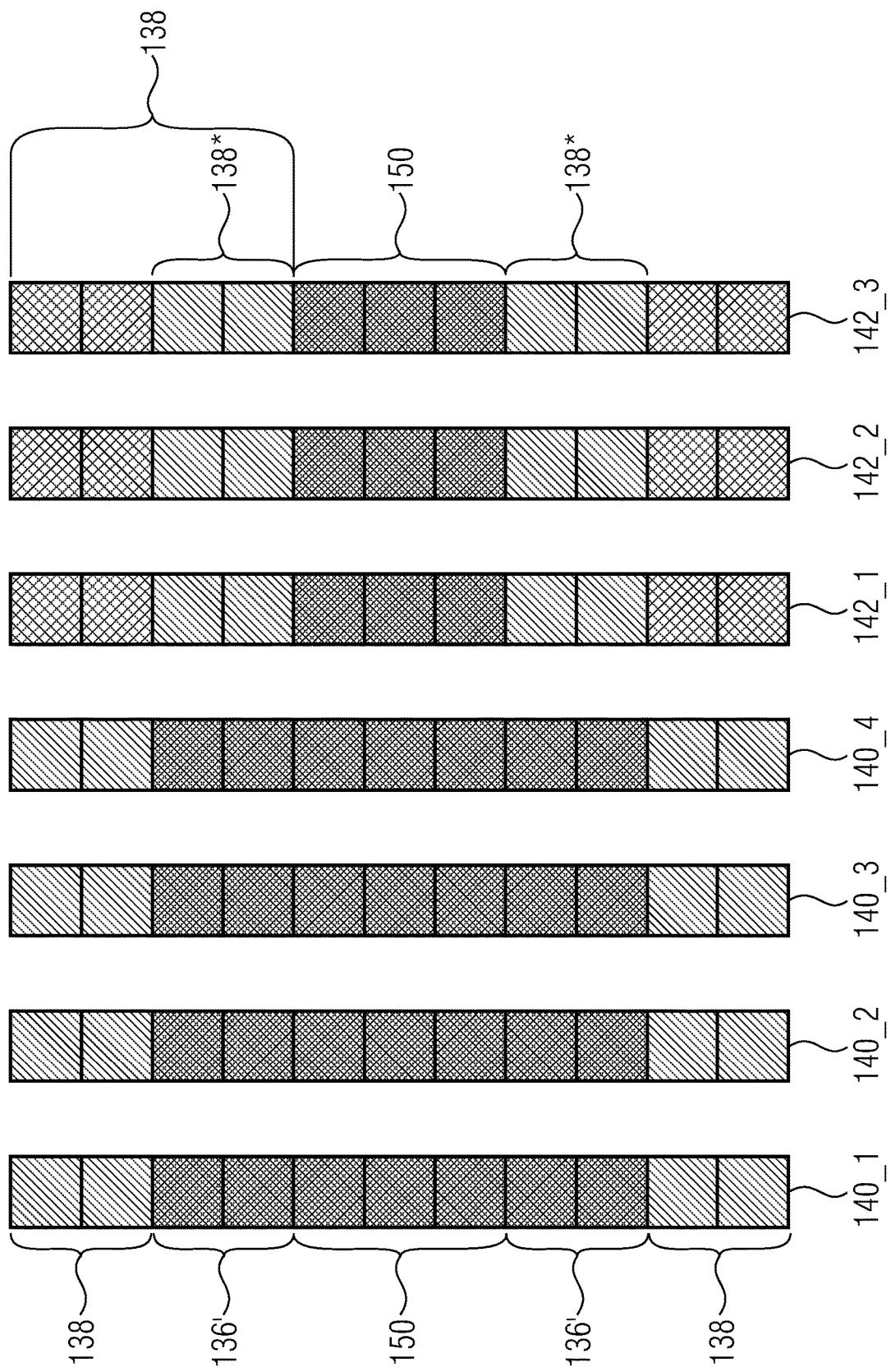
FIG. 16 shows in a diagram a division of the core symbols and extension symbols into core sub-data packets and extension sub-data packets, wherein (partial) synchronization symbol sequences arranged in the center are present in the respective sub-data packets.
Figure 17:
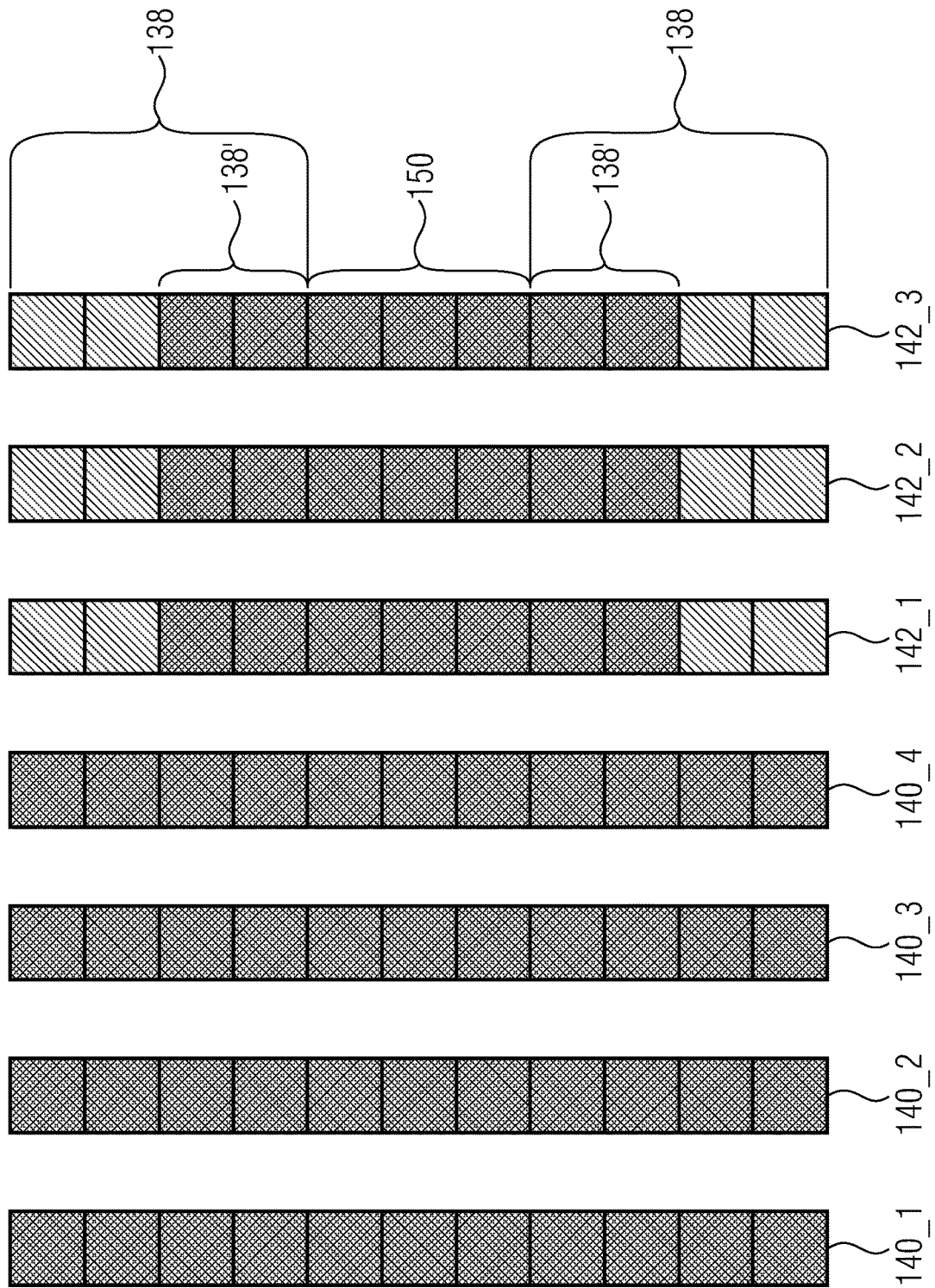
FIG. 17 shows in a diagram a division of the core symbols and extension symbols into core sub-data packets and extension sub-data packets, wherein (partial) synchronization symbol sequences arranged in the center are present in the respective sub-data packets.

For example, this principle is illustrated in FIGS. 15 to 17.

In detail, FIG. 15 shows in a diagram a division of the core symbols 136 and the extension symbols 138 into the core sub-data packets 140_1 to 140_4 and extension sub-data packets 142_1 to 142_3, wherein in the respective sub-data packets there are (partial) synchronization symbol sequences 150 arranged in the center. In this case, the abscissa describes a temporal arrangement of the sub-data packets (core sub-data packets 140_1 to 140_4 plus extension sub-data packets 142_1 to 142_3), while the ordinate describes a temporal arrangement of the symbols (core symbols+extension symbols) in the respective sub-data packets.

As can be seen in FIG. 15, the core symbols 136 in the core sub-data packets 140_1 to 140_4 and a part 138* of the extension symbols 138 in the extension sub-data packets 142_1 to 142_3 may be well decoded due to the low temporal distance to the synchronization symbols 150.

In other words, FIG. 15 shows that the core symbols 136 in sub-packets 0 to 3 (140_1 to 140_3) and the extension symbols 138* in sub-packets 4 to 6 (142_1 to 142_3) may be well decoded due to the proximity to the synchronization symbols 150.

FIG. 16 shows in a diagram a division of the core symbols 136 and the extension symbols 138 into the core sub-data packets 140_1 to 140_4 and extension sub-data packets 142_1 to 142_3, wherein in the respective sub-data packets there are (partial) synchronization symbol sequences 150 arranged in the center. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols) in the respective sub-data packets.

As can be seen in FIG. 16, the core symbols 136 in the core sub-data packets 140_1 to 140_4 may be re-encoded after decoding in order to obtain re-encoded core symbols 136' that, together with the synchronization symbols 150, may be seen as known symbols that may be used for decoding the extension symbols 138 so that the extension symbols may now also be well decoded due to the proximity to the non-symbols (synchronization symbols 150+re-encoded core symbols 136').

In other words, FIG. 15 shows that the core symbols 136' may be presumed to be known after re-encoding them, and increase the decodability of the adjacent extension symbols 138 in sub-packets 0 to 3 (140_1 to 140_3).

FIG. 17 shows in a diagram a division of the core symbols 136 and extension symbols 138 into core sub-data packets 140_1 to 140_4 and the extension sub-data packets 142_1 to 142_3, wherein in the respective sub-data packets there are (partial) synchronization symbol sequences 150 arranged in the center. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols) in the respective sub-data packets.

As can be seen in FIG. 17, the part 138* of the extension symbol 138 in the core sub-data packets 140_1 to 140_4 may be re-encoded after decoding in order to obtain the re-encoded part 138* of the extension symbols which, together with the synchronization symbols 150, may be seen as known symbols that may be used for decoding the remaining extension symbols 138 so that the remaining extension symbols may now also be well decoded due to the proximity to the known symbols (synchronization symbols 150+re-encoded part 138' of the extension symbols).

In other words, FIG. 17 shows that the reliable extension symbols 138* may also be re-encoded after the first iterative decoding step and may also be presumed to be known 138' and now extend the reliability area in the sub-packets 4 to 6 (142_1 to 142_3).

For the interleaver, this means that symbols needed earlier during the iterative decoding are placed closer to the synchronization sequences.

In embodiments, the earlier the symbols are needed during the iterative decoding of the extension word, the closer they may be placed to the core symbols or synchronization symbols.

Tenth Detailed Embodiment: Avoiding Intra-Hop Bias

In order to avoid a possible imbalance when arranging the core symbols 136 around the synchronization symbols 150 (e.g. by unreliabilities in the synchronization sequence which do not occur at the end of the synchronization sequence, however), the symbols are arranged the other way around in every second sub-packet. If the core symbol 0 (k0) has been inserted above the synchronization sequence (150) in the sub-packet 0 (140_1), the core symbol 1 (k1) in the sub-packet 1 (140_2) is to be arranged below the synchronization sequence (150).

Figure 18:
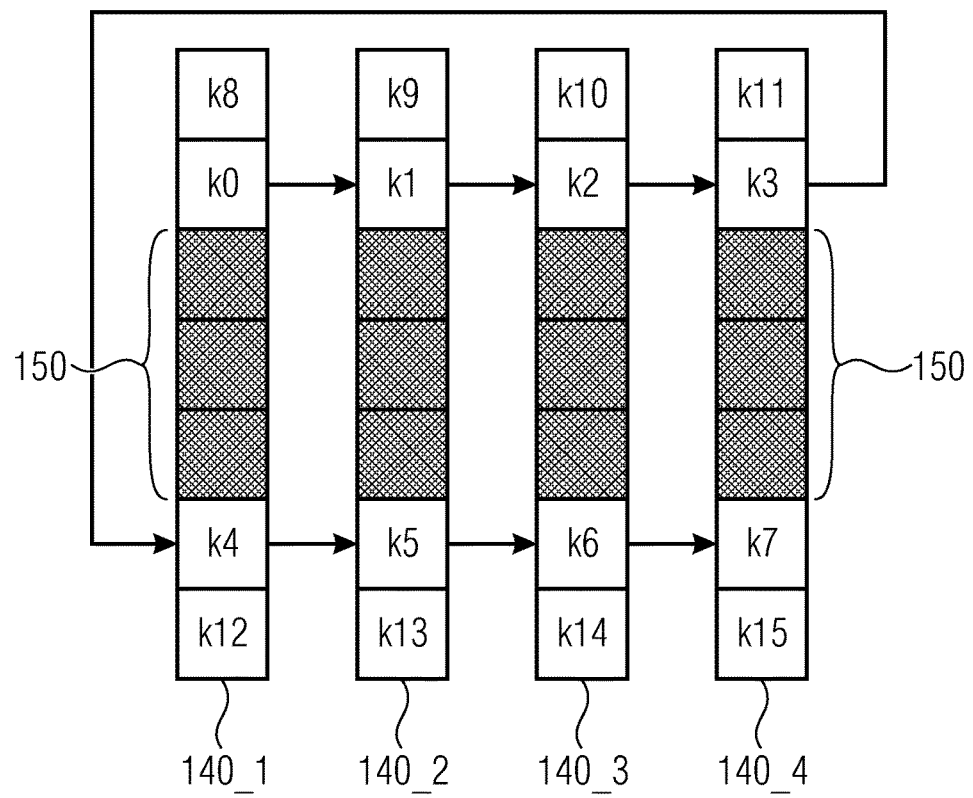
FIG. 18 shows in a diagram a division of the core symbols into core sub-data packets, wherein (partial) synchronization symbol sequences arranged in the center are present in the respective core sub-data packets.

FIG. 18 shows in a diagram a division of the core symbols k0 to k15 into the core sub-data packets 140_1 to 140_4, wherein in the respective core sub-data packets 140_1 to 140_2 there are (partial) synchronization symbol sequences 150 arranged in the center. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols) in the respective sub-data packets.

As can be seen in FIG. 18, the core symbols k0 to k15 may be distributed in an even interleaved manner to the core sub-data packets 140_1 to 140_4 so that the loss of one of the core sub-data packets 140_1 to 140_3 does not lead to the total loss of the decoding possibility. For example, the first core sub-data packet 140_1 may contain the core symbols k0, k4, k8 and k12, the second core sub-data packet 140_2 may contain the core symbols k1, k5, k9, k13, the third core sub-data packet 140_3 may contain the core symbols k2, k6, k10 and k14, and the fourth core data packet 140_4 may contain the core symbols k3, k7, k11 and k15, wherein the core symbols k0 to k3 in the respective core sub-data packets 140_1 to 140_4 are arranged directly in front of the synchronization symbols 150, and the core symbols k4 to k7 in the respective core sub-data packets 140_1 to 140_4 are arranged directly behind the synchronization symbols 150.

In other words, FIG. 18 shows a division of the core symbols k0 to k15 into the core sub-data packets 140_1 to 140_4 without avoiding a bias. Successive symbols are located on the same side (of the synchronization symbols 150).

Figure 19:
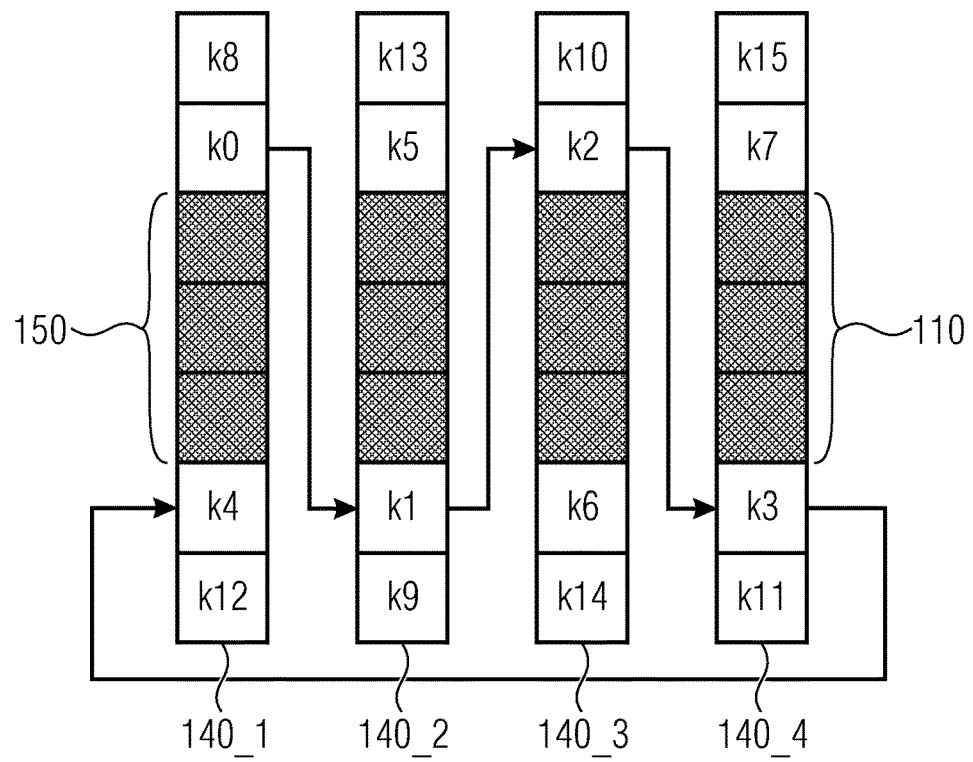
FIG. 19 shows in a diagram a division of the core symbols into core sub-data packets, wherein (partial) synchronization symbol sequences arranged in the center are present in the respective core sub-data packets, wherein the core symbols are divided into successive core sub-data packets in an alternating manner in front of and behind the (partial) synchronization symbol sequences.

FIG. 19 shows in a diagram a division of core symbols k0 to k15 into the core sub-data packets 140_1 to 140_4, wherein in the respective core sub-data packets 140_1 to 140_2 there are (partial) synchronization symbol sequences 150 arranged in the center, wherein the core symbols k0 to k15 are distributed in successive core sub-data packets 140_1 to 140_4 alternatively in front of and behind the (partial) synchronization sequences 150. In this case, the abscissa describes a temporal arrangement of the sub-data packets (core sub-data packets 140_1 to 140_4+extension sub-data packets 142_1 to 142_3), while the ordinate describes a temporal arrangement of the symbols (core symbols+extension symbols) in the respective sub-data packets.

As can be seen in FIG. 19, the core symbols k0 to k15 may be distributed in an interleaved manner to the core sub-data packets 140_1 to 140_4 such that the core symbols k0 to k15 are arranged in successive core sub-data packets 140_1 to 140_4 alternatively in front of and behind the (partial) synchronization symbol sequences 150.

For example, the first core sub-data packet 140_1 may contain the core symbols k0, k4, k8 and k12, the second core sub-data packet 140_2 may contain the core symbols k1, k5, k9, k13, the third core sub-data packets 140_3 may contain the core symbols k2, k6, k10 and k14, and the fourth core data packet 140_4 may contain the core symbols k3, k7, k11 and k15, wherein the core symbols k0, k5, k2 and k7 in the respective core sub-data packets 140_1 to 140_4 are arranged directly in front of the synchronization symbols 150, and the core symbols k4, k1, k6 and k3 in the respective core sub-data packets 140_1 to 140_4 are arranged directly behind the synchronization symbols 150.

In other words, FIG. 19 shows a division of the core symbols k0 to k15 into core sub-data packets 140_1 to 140_4 with avoiding a bias. Successive symbols are placed in an alternating manner around the center (of the synchronization symbols 150).

Further Embodiments

Figure 20:
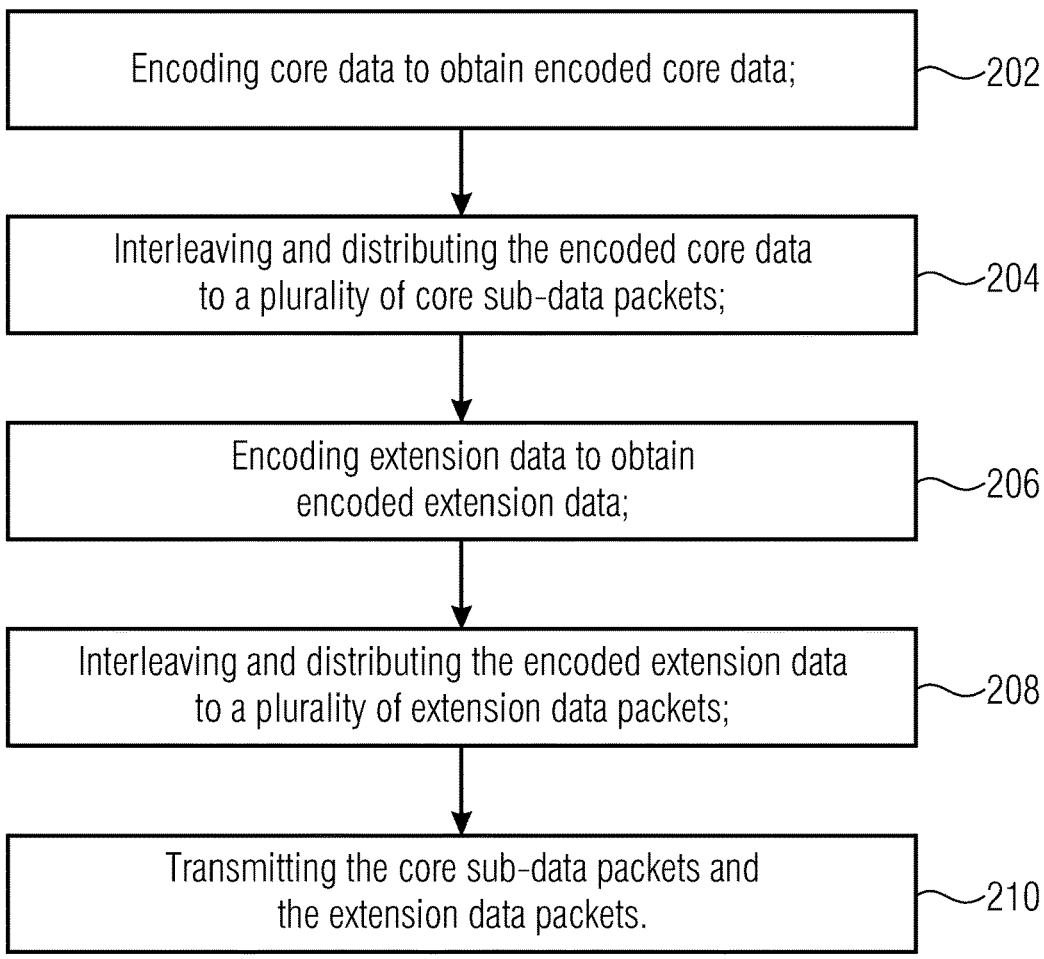
FIG. 20 shows a flow diagram of a method for transmitting core data and extension data.

FIG. 20 shows a flow diagram of a method 200 for transmitting core data and extension data. The method 200 includes a step 202 of encoding core data in order to obtain encoded core data. The method 200 further includes a step 204 of interleaving and distributing the encoded core data to a plurality of core sub-data packets. The method 200 further includes a step 206 of encoding extension data to obtain encoded extension data. The method 200 further includes a step 208 of interleaving and distributing the encoded extension data to a plurality of extension data packets. The method 200 further includes a step 210 of transmitting the core sub-data packets and extension data packets.

Figure 21:
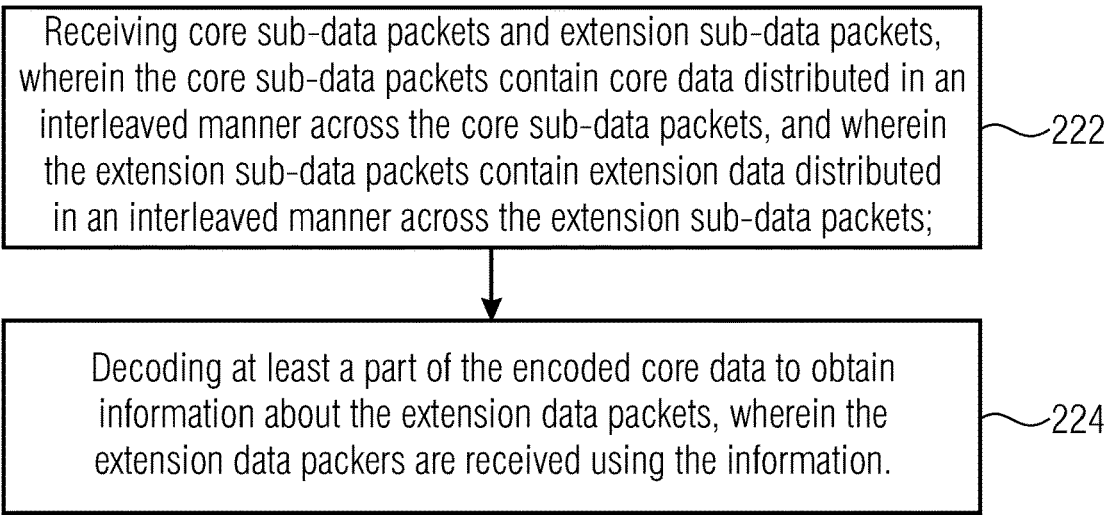
FIG. 21 shows a flow diagram of a method for receiving core data and extension data according to an embodiment.

FIG. 21 shows a flow diagram of a method 220 for receiving core data and extension data. The method 220 includes a step 222 of receiving core sub-data packets and extension sub-data packets, wherein the core sub-data packets contain core data distributed in an interleaved manner across the core sub-data packets, and wherein the extension sub-data packets contain extension data distributed in an interleaved manner across the extension sub-data packets. The method 220 further includes a step 224 of decoding at least a part of the encoded core data to obtain information with respect to the extension data packet, wherein the extension data packets are received using the information.

Although embodiments in which the extension sub-packets are arranged temporally after the core sub-packets were described, it is to be noted that the present invention is not limited to such embodiments. Rather, the extension sub-packets may also be arranged temporally in front of or simultaneously to the core sub-packets, e.g. when using a reception buffer.

Embodiments interleave the data into sub-packet blocks. Embodiments concern a method for distributing information across the sub-packets such that a loss of one or several sub-packets affects the decodability of the overall packet as little as possible.

Embodiments use core information having a length indication. In addition, a part of the information may already be decoded and processed through intelligent distribution before receiving the overall packet (core sub-data packets+extension sub-data packets). This also enables transmitting, e.g., a variable number of sub-packets if the receiver is informed through this information about the number of the sub-packets or the length of the packet to be received.

In embodiments, the core information/extension information may also be well protected when having a short length. Previous systems having a core block and an optional extension sequence have problems protecting the extension sequence or the core sequence with a good error protection if these are just very short. It is known [S. Dolinar, D. Divsalar and F. Pollara, "Code performance as a function of block size", TMO progress report, vol. 42, p. 133, 1998] that small amounts of data cannot be well protected. Channel-coding both parts together increases the overall length of the data and therefore the error protection.

Embodiments increase a decision reliability of the core information symbols. Previous systems do not use the fact that the decision reliability of the symbols is improved close to known symbols. This invention describes a method for interleaving the symbols such that the core symbols obtain higher decision reliability upon reception by selecting their position within the sub-packet such that they may be decoded more reliably.

Embodiments relate to a method for intelligently interleaving the symbols during a transfer. Interleaving is based on sub-packets across which the symbols are distributed, which allows the loss of individual sub-packets during the transfer. In addition, the symbols may be arranged in a sub-packet such that core information may be extracted before the completed reception of all sub-packets. Embodiments further describe how the reliability of the transfer of the core information may be increased by arranging the symbols.

Embodiments provide a system for the transfer of data between different participants of a radio network, wherein the data to be transferred is divided into core information and extension information.

Embodiments may be applied to traditional transfer methods and to telegram splitting-based transfer methods, i.e. the division of the transfer into several sub-data packets transmitted in a temporally offset manner.

Embodiments enable decoding (e.g. by the receiver) a part of the information to be transferred (e.g. the core information) even before the reception of the total data packet (i.e. the extension information).

Embodiments enable improved (or even optimal) interleaving of the data.

In embodiments, the core information is available before the completed reception.

In embodiments, the core information may also be protected when having a short length.

Embodiments enable an increased decision reliability of the core information symbols.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed while using a hardware device, such as a microprocessor, a programmable computer or an electronic circuit. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier.

In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded. The data carrier, the digital storage medium, or the recorded medium are typically tangible, or non-volatile.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing unit, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU), or may be a hardware specific to the method, such as an ASIC.

For example, the apparatuses described herein may be implemented using a hardware device, or using a computer, or using a combination of a hardware device and a computer.

The apparatuses described herein, or any components of the apparatuses described herein, may at least be partially implement in hardware and/or software (computer program).

For example, the methods described herein may be implemented using a hardware device, or using a computer, or using a combination of a hardware device and a computer.

The methods described herein, or any components of the methods described herein, may at least be partially implement by performed and/or software (computer program).

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A data transmitter configured to encode core data and to distribute the encoded core data in an interleaved manner to a plurality of core sub-data packets, wherein the data transmitter is configured to encode extension data and to distribute the encoded extension data in an interleaved manner to a plurality of extension sub-data packets, wherein at least a part of the encoded core data contained in the core sub-data packets is needed for receiving the encoded extension data or extension sub-data packets at a data receiver side;
    wherein the plurality of core sub-data packets is transferred using a time hopping pattern defining temporal distances between the plurality of core sub-data packets and/or a frequency hopping pattern defining frequency distances between the plurality of core sub-data packets;
    wherein the plurality of extension sub-data packets is transferred using a time hopping pattern defining temporal distances between the plurality of extension sub-data packets and/or a frequency hopping pattern defining frequency distances between the plurality of extension sub-data packets;
    wherein the data transmitter is configured to distribute in an interleaved manner the encoded extension data to the core sub-data packets to fill the core sub-data packets, in response to a length of the encoded core data being insufficient for filling the core sub-data packets.

2. The data transmitter according to claim 1, wherein the data transmitter is configured to distribute the encoded core data to the core sub-data packets to enable a receiver-side decoding of the encoded core data based on other core sub-data packets of the core sub-data packets even upon transfer loss of one or several of the core sub-data packets.

3. The data transmitter according to claim 1, wherein the data transmitter is configured to distribute the encoded core data to the core sub-data packets such that a distance of the encoded core data is increased with respect to an influence length of a code used for encoding the core data.

4. The data transmitter according to claim 1, wherein the data transmitter is configured to distribute, when filling the core sub-data packets, the encoded extension data to the core sub-data packets and extension sub-data packets such that a distance of the encoded extension data is increased with respect to an influence length of a code used for encoding the extension data.

5. The data transmitter according to claim 1, wherein the data transmitter is configured to distribute, when filling the core sub-data packets, the encoded extension data to the core sub-data packets and extension sub-data packets such that the core sub-data packets and extension sub-data packets are evenly filled.

6. The data transmitter according to claim 1, wherein the data transmitter is configured to distribute, when filling the core sub-data packets, the encoded extension data to the core sub-data packets and extension sub-data packets such that the core sub-data packets and extension sub-data packets are unevenly filled.

7. The data transmitter according to claim 1, wherein the data transmitter is configured to distribute the encoded core data to a fixed or specified number of core sub-data packets.

8. The data transmitter according to claim 1, wherein the data transmitter is configured to adjust a number of the extension sub-data packets depending on a length of the extension data.

9. The data transmitter according to claim 1, wherein the data transmitter is configured to encode the core data and the extension data together.

10. The data transmitter according to claim 9, wherein the core data and the extension data are encoded together such that decoding the encoded core data delivers at least a part of the core data.

11. The data transmitter according to claim 1, wherein the data transmitter is configured to encode the core data and the extension data independently of each other.

12. The data transmitter according to claim 1, wherein the data transmitter is configured to fill the non-encoded core data with extension data so that the extension data is arranged temporally in front of the core data and the reliability is increased when decoding the core data.

13. The data transmitter according to claim 1, wherein the data transmitter is configured to further distribute the encoded extension data to at least one portion of the core sub-data packets so that in the respective core sub-data packets a part of the encoded extension data is arranged temporally in front of the encoded core data so that a reliability is increased when decoding the encoded core data.

14. The data transmitter according to claim 1, wherein the data transmitter is configured to provide at least a portion of the core sub-data packets with synchronization data.

15. The data transmitter according to claim 14, wherein the data transmitter is configured to arrange the encoded core data temporally adjacent to the synchronization data in the respective core sub-data packets.

16. The data transmitter according to claim 14, wherein the data transmitter is configured to arrange the core data alternatively in front of and behind the synchronization data in temporally successive core sub-data packets.

17. The data transmitter according to claim 14, wherein the data transmitter is configured to temporally arrange the synchronization data in the respective core sub-data packets such that the synchronization data is arranged immediately adjacent to the encoded extension data and immediately adjacent to the encoded core data.

18. The data transmitter according to claim 1, wherein the data transmitter is further configured to transmit pure synchronization sub-data packets.

19. The data transmitter according to claim 18, wherein the data transmitter is configured to transmit the core sub-data packets and the synchronization sub-data packets such that the core sub-data packets and the synchronization sub-data packets are arranged temporally adjacent to each other.

20. A data receiver configured to receive core sub-data packets and extension sub-data packets, wherein the core sub-data packets comprise encoded core data distributed in an interleaved manner across the core sub-data packets, and wherein the extension sub-data packets contain encoded extension data distributed in an interleaved manner across the extension sub-data packets, wherein the encoded extension data is distributed to the core sub-data packets to fill the core sub-data packets, in response to a length of the encoded core data being insufficient for filling the core sub-data packets;
  wherein the data receiver is configured to decode at least a part of the encoded core data to acquire information with respect to the encoded extension data or the extension sub-data packets;
  wherein the data receiver is configured to receive the extension data packets using the information;
  wherein the plurality of core sub-data packets is transferred using a time hopping pattern defining temporal distances between the plurality of core sub-data packets and/or a frequency hopping pattern defining frequency distances between the plurality of core sub-data packets;
  wherein the plurality of extension sub-data packets is transferred using a time hopping pattern defining temporal distances between the plurality of extension sub-data packets and/or a frequency hopping pattern defining frequency distances between the plurality of extension sub-data packets.

21. The data receiver according to claim 20, wherein a number of the core sub-data packets is known to the data receiver.

22. The data receiver according to claim 20, wherein the information with respect to the extension sub-data packets comprises a number of the extension sub-data packets.

23. The data receiver according to claim 20, wherein the encoded core data is distributed to the core sub-data packets such that even upon a transfer loss of one or several of the core sub-data packets to enable a receiver-side decoding of the encoded core data based on other core sub-data packets of the core sub-data packets;
  wherein the data receiver is configured to receive and decode at least a portion of the core sub-data packets to acquire the core data.

24. The data receiver according to claim 20, wherein at least a portion of the core sub-data packets is provided with synchronization data;
  wherein the data receiver is configured to detect the core sub-data packets in a reception data stream based on at least a portion of the synchronization data.

25. The data receiver according to claim 20, wherein the data receiver is configured to receive pure synchronization sub-data packets, and to detect the core sub-data packets in a reception data stream based on at least a portion of the synchronization sub-data packets.

26. The data receiver according to claim 20, wherein the data receiver is configured to re-encode at least a part of the decoded core data to acquire re-encoded core data;
   wherein the data receiver is configured to decode at least a part of the encoded extension data using the re-encoded core data.

27. The data receiver according to claim 20, wherein the data receiver is configured to decode and to re-encode a first part of the encoded extension data in order to acquire a first part of re-encoded extension data;
   wherein the data receiver is configured to decode a second part of the encoded extension data using the first part of re-encoded extension data.

28. A method comprising:
   encoding core data to acquire encoded core data;
   interleaving and distributing the encoded core data to a plurality of core sub-data packets;
   encoding extension data to acquire encoded extension data;
   interleaving and distributing the encoded extension data to a plurality of extension data packets;
   transmitting the core sub-data packets and extension data packets;
   wherein at least a part of the encoded core data contained in the core sub-data packets is needed for receiving the encoded extension data or extension sub-data packets;
   wherein the plurality of core sub-data packets is transferred using a time hopping pattern defining temporal distances between the plurality of core sub-data packets and/or a frequency hopping pattern defining frequency distances between the plurality of core sub-data packets;
   wherein the plurality of extension sub-data packets is transferred using a time hopping pattern defining temporal distances between the plurality of extension sub-data packets and/or a frequency hopping pattern defining frequency distances between the plurality of extension sub-data packets;
   wherein the encoded extension data is distributed to the core sub-data packets to fill the core sub-data packets, in response to a length of the encoded core data being insufficient for filling the core sub-data packets.

29. A method comprising:
   receiving core sub-data packets and extension sub-data packets, wherein the core sub-data packets contain core data distributed in an interleaved manner across the core sub-data packets, and wherein the extension sub-data packets contain extension data distributed in an interleaved manner across the extension sub-data packets, wherein the encoded extension data is distributed to the core sub-data packets to fill the core sub-data packets, in response to a length of the encoded core data being insufficient for filling the core sub-data packets;
   decoding at least a part of the encoded core data to acquire information with respect to the extension data packets;
   wherein the extension data packets are received using the information;
   wherein the plurality of core sub-data packets is transferred using a time hopping pattern defining temporal distances between the plurality of core sub-data packets and/or a frequency hopping pattern defining frequency distances between the plurality of core sub-data packets;
   wherein the plurality of extension sub-data packets is transferred using a time hopping pattern defining temporal distances between the plurality of extension sub-data packets and/or a frequency hopping pattern defining frequency distances between the plurality of extension sub-data packets.

30. A non-transitory digital storage medium having a computer program stored thereon to perform the method comprising:
   encoding core data to acquire encoded core data;
   interleaving and distributing the encoded core data to a plurality of core sub-data packets;
   encoding extension data to acquire encoded extension data;
   interleaving and distributing the encoded extension data to a plurality of extension data packets;
   transmitting the core sub-data packets and extension data packets;
   wherein at least a part of the encoded core data contained in the core sub-data packets is needed for receiving the encoded extension data or extension sub-data packets;
   wherein the plurality of core sub-data packets is transferred using a time hopping pattern defining temporal distances between the plurality of core sub-data packets and/or a frequency hopping pattern defining frequency distances between the plurality of core sub-data packets;
   wherein the plurality of extension sub-data packets is transferred using a time hopping pattern defining temporal distances between the plurality of extension sub-data packets and/or a frequency hopping pattern defining frequency distances between the plurality of extension sub-data packets;
   wherein the encoded extension data is distributed to the core sub-data packets to fill the core sub-data packets, in response to a length of the encoded core data being insufficient for filling the core sub-data packets,
   when said computer program is run by a computer.

31. A non-transitory digital storage medium having a computer program stored thereon to perform the method comprising:
   receiving core sub-data packets and extension sub-data packets, wherein the core sub-data packets contain core data distributed in an interleaved manner across the core sub-data packets, and wherein the extension sub-data packets contain extension data distributed in an interleaved manner across the extension sub-data packets, wherein the encoded extension data is distributed to the core sub-data packets to fill the core sub-data packets, in response to a length of the encoded core data being insufficient for filling the core sub-data packets;
   decoding at least a part of the encoded core data to acquire information with respect to the extension data packets;
   wherein the extension data packets are received using the information;
   wherein the plurality of core sub-data packets is transferred using a time hopping pattern defining temporal distances between the plurality of core sub-data packets and/or a frequency hopping pattern defining frequency distances between the plurality of core sub-data packets;
   wherein the plurality of extension sub-data packets is transferred using a time hopping pattern defining temporal distances between the plurality of extension sub-data packets and/or a frequency hopping pattern defining frequency distances between the plurality of extension sub-data packets,
when said computer program is run by a computer.

\* \* \* \* \*